(12) United States Patent
Chan

(10) Patent No.: US 6,466,898 B1
(45) Date of Patent: Oct. 15, 2002

(54) MULTITHREADED, MIXED HARDWARE DESCRIPTION LANGUAGES LOGIC SIMULATION ON ENGINEERING WORKSTATIONS

(76) Inventor: Terence Chan, 15 Macpherson Pl., Danville, CA (US) 94526

( * ) Notice: Subject to any disclaimer, the term of this patent is extended or adjusted under 35 U.S.C. 154(b) by 0 days.

(21) Appl. No.: 09/229,134

(22) Filed: Jan. 12, 1999

(51) Int. Cl.[7] .............................................. G06F 17/50
(52) U.S. Cl. ........................... 703/17; 703/16; 703/14; 703/15; 703/19; 703/20; 716/6; 716/2; 716/3; 716/18; 716/16
(58) Field of Search ............................ 703/14, 15, 16, 703/17, 19, 20; 716/6, 2, 3, 18, 16

(56) References Cited

U.S. PATENT DOCUMENTS

| | | | | | |
|---|---|---|---|---|---|
| 5,732,247 | A | * | 3/1998 | Dearth et al. ................. | 716/18 |
| 5,774,368 | A | * | 6/1998 | Chen et al. .................... | 716/18 |
| 5,857,091 | A | * | 1/1999 | Fernandes et al. ............ | 716/18 |
| 5,870,588 | A | * | 2/1999 | Rompaey et al. ............. | 716/18 |
| 5,905,883 | A | * | 5/1999 | Kasuya ......................... | 716/18 |
| 5,999,734 | A | * | 12/1999 | Willis et al. .................. | 716/18 |
| 6,152,612 | A | * | 11/2000 | Liao et al. .................... | 716/18 |
| 6,212,667 | B1 | * | 4/2001 | Geer et al. ..................... | 716/6 |
| 6,226,780 | B1 | * | 5/2001 | Bahra et al. .................. | 716/18 |
| 6,230,307 | B1 | * | 5/2001 | Davis et al. .................. | 716/16 |
| 6,263,483 | B1 | * | 7/2001 | Dupenloup .................. | 716/18 |

OTHER PUBLICATIONS

"A Portable Mechanism for Vectorizing Compiled Event–Driven Simulation", Mittra., IEEE, 1997.*
"A Hierarchical Compiled Code Event–Driven Logic Simulator", Lewis, IEEE, 1991.*
"An Efficient Strategy for Developing a Simulator for a Novel Concurrent Multithreaded Processor Architecture", Jian Huang et al., IEEE, Jul. 1998.*

* cited by examiner

*Primary Examiner*—Hugh M. Jones
*Assistant Examiner*—William Thomson
(74) *Attorney, Agent, or Firm*—Chi Ping Chang; Pacific Law Group LLP

(57) ABSTRACT

This invention describes a multithread HDL logic simulator that is unique from the prior arts. Specifically, it can process both VHDL and Verilog languages in a single program, and it uses special concurrent algorithms to accelerate the tool's performance on multiprocessor platforms to achieve linear to super-linear scalability on multiprocessor systems. Furthermore, the invention includes a unique remote logic simulation and job scheduling capabilities.

59 Claims, 16 Drawing Sheets

| File | View | Radix | Time | | |
|---|---|---|---|---|---|
| Time | I1 | I2 | O1 | O2 | x1 |
| 0.0 | 1 | 0 | 10101 | 0 | 0 |
| 8.0 | 1 | 1 | 10101 | 0 | 0 |
| 8.0 | 1 | 1 | 10101 | 0 | 0 |
| 9.0 | 0 | 1 | 11111 | 0 | 1 |
| 12.0 | 0 | 0 | 11111 | 0 | 1 |
| 19.0 | 0 | 1 | 11111 | 0 | 1 |
| 21.0 | 0 | 0 | 11111 | 0 | 1 |

Figure 6

```
# Clocks specification for ckt. LFSR100K

CLK ;    # use clock period defined in HDL file
CLK2  1/15 0/20;   # clock period = 35
CLK3  1/10 0/5 1/15 0/20;   # multi-phase clock
``` define these for mixed event-driven and cycle-based simulation
Cycle = ( CLK, L1, L2 );

Legend: H - per-thread specific heap memory
E - per-thread specific event queue
F - per-thread specific fanut queue

```
void do_thread_work( void* thr_attribute_pointer )
{
        int swap_var = 0;
        while ( swap_var == 0)
        {
            SWAP(swap_var, -1);      // reset to 0
            /* start of a simulation cycle */
            int inner_cnt = 1;
            while (A) {
                  while (B == inner_cnt) {
                        inner_cnt = inner_cnt + 1;
                        /* do signal and logic gate events */
                  }
            }
        }
}
```

| Time (ns) | I1 | I2 | O1 | O2 | x1 |
|---|---|---|---|---|---|
| 0.0 | 1 | 0 | 10101 | 0 | 0 |
| 8.0 | 1 | 1 | 10101 | 0 | 0 |
| 8.0 | 1 | 1 | 10101 | 0 | 0 |
| 9.0 | 0 | 1 | 11111 | 0 | 1 |
| 12.0 | 0 | 0 | 11111 | 0 | 1 |
| 19.0 | 0 | 1 | 11111 | 0 | 1 |
| 21.0 | 0 | 0 | 11111 | 0 | 1 |

MULTITHREADED, MIXED HARDWARE DESCRIPTION LANGUAGES LOGIC SIMULATION ON ENGINEERING WORKSTATIONS

BACKGROUND OF THE INVENTION

Logic simulator is an essential electronic design automation (EDA) tool to facilitate the design and debug of very large scale integrated (VLSI) circuit. Examples of these VLSI designs include microprocessors for personal computers and workstations, micro-controllers for embedded systems, and internetworking routers and switches, etc. The VLSI circuit designers use logic simulators to simulate and verify the functional behavior and timing characteristics of their circuit designs on their engineering workstations before committing such designs to fabrication. The benefits of the logic simulators are to reduce new product development time and costs, and to improve engineer productivity and product quality.

Referring to FIG. 1, the operations of a logic simulator is depicted. Specifically, a user's inputs to a logic simulator are one or more text files, which describe the specification of his circuit. These design files are usually coded in a hardware description language (HDL). In addition, the user also provides an input stimulus file to the simulator. This file may consist of input vectors to be applied to the circuit at specified time intervals, and/or some behavioral HDL code that describes how various signals (i.e., clocks and global reset signals) in the circuits are to change states during the simulation.

The logic simulator compiles the design files and stimulus file supplied by the user into a database. It may flag any errors it detects in the design files or stimulus file. These errors may include syntax errors, undefined library cells, signals with no driver and/or receivers, and bus contentions, etc. After the input files are successfully compiled, the logic simulator applies input stimulus to the circuit and performs simulation of the circuit for the duration of time as specified by the user. During simulation, the simulator also keeps track of the changes of states of any user-selected signals in the design. At the completion of the simulation, the simulator will bring up a graphical waveform window or a tabular state-listing window to show the user the selected signal states for the entire simulation run.

There are two types of logic simulators being widely used namely, event-driven logic simulator and cycle-based logic simulator. The event-driven logic simulators are the traditional simulators, which model both the functional and timing behaviors of user circuits. They can be applied for any type of digital designs. The cycle-based simulator, on the other hand, models only the functional behaviors of user designs. Thus, a cycle-based simulator runs faster (up to 10 time or more) than an event-driven simulator, but it does not provide timing verification of user designs and is suitable only for synchronous designs (synchronous designs are those that one or more master clocks controlling all activities in the designs)

In the 1980s to early 1990s, most EDA vendors offered event-driven logic simulators running on either UNIX-based workstations or Windows-based personal computers. However, as VLSI designs get larger and more complex, the time to perform simulation on those general-purpose workstations and personal computers grew exponentially. To reduce the design verification time, many EDA vendors are offering cycle-based simulators to allow users, at their own elections, to trade-off accuracy with speed. Users who use cycle-based simulators must also use a separate tool (e.g., a static timing analyzer) to verify the correctness of the timing characters of their designs.

Besides offering cycle-based simulators, some EDA vendors have introduced hardware-accelerators or hardware emulators to speed up the simulation of large designs. Specifically, a hardware accelerator hardwires the logic simulation algorithm into hardware, so that it can speedup the simulation of any given design by 10 to 100 times. A hardware emulator, on the other hand, programs a group of field-programmable gate array (FPGA) chips to emulate the logic functions of a given design, and it "simulates" the designs in real hardware speed. A hardware emulator can speedup simulation by a 1000 times or more. The drawback of the hardware accelerators and hardware emulators are that they are very expansive and designers can use them only on a time-sharing basis. Thus, they are mostly used as regression testing tools and not a debug tool. Furthermore, since they do not accurately model timing characteristic of user designs, the users still need to use other tools, like a static timing analyzer, to verify the timing behavior of their circuits separately.

With the recent introduction of multiprocessor workstations (UNIX-based and Windows™-based), some EDA vendors have realized that they can accelerate their tools performance by porting their applications onto such workstations. By using multiple microprocessors (CPUs) concurrently on these workstations, the performance of their tools can rival that of hardware accelerators and emulators, while still provides all the benefits of a traditional logic simulator. Furthermore, the multiprocessor workstations cost much less (i.e., ten to hundred times less) than that of hardware accelerators and emulators, and can be used for other engineering services in addition to logic simulation (e.g., act as file servers or electronic mail servers). Thus, use of multiprocessor workstations in VLSI design houses seems to be the future trend in the industry.

EDA tools that employ multiple CPUs on a single workstation to accelerate their performance are said to be multithreaded. Specifically, a thread is a process flow in a program that runs on a CPU. If a program can have multiple threads executing on multiple CPUs concurrently, then its is a multithreaded applications. Most EDA applications available today are single-threaded, which means that those applications performance on a multiprocessor system is still the same as that running on a single system.

Most VLSI designers use a hardware description language (HDL) to write their designs. The most commonly used hardware description languages are VHDL (VHSIC Hardware Description Language, where VHSIC stands for Very High Speed Integrated Circuit) and Verilog. They are standardized by the IEEE (Institute of Electrical and Electronic Engineering) society, and are widely supported by the electronics and semiconductor industries around the world. Most commercial logic simulators support either VHDL or Verilog language. A few EDA vendors provide a simulation backplane to interconnect a VHDL and a Verilog simulator, so that a user can simulate his VLSI design coded in both VHDL and Verilog. These products are not very popular as they are expensive (i.e., users need to purchase two separate simulators and the backplane) and inefficient in their performance.

Referring to Table 1, it lists the major commercial HDL logic simulators, their features and the HDL languages they supported. There are currently three EDA vendors that sell multithreaded logic simulators. Synopsys Incorporated sells a multithreaded event-driven logic simulator on UNIX platforms; QuickTurn Design Systems and Avanti Corporation offer multithreaded cycle-based logic simulators on UNIX platforms. It is noted, however, none of these vendors offers any multithreaded logic simulators that support the multiprocessor Linux and Windows™ platforms. In addition, It should be further noted there is no commercial logic simulator that supports both the VHDL and Verilog languages, and is also multithreaded.

There is therefore an apparent need for a general-purpose multithreaded logic simulator that supports both the VHDL and Verilog languages in a single program to perform both a event-driven and a cycle-based logic simulation on a multiprocessor platform chosen by a user. There is a further need that such general-purpose multithreaded logic simulator can support both the local and remote users through its network resources.

Accordingly, one object of the invention is to provide for a new multithreaded logic simulator that uses unique algorithms to achieve excellent performance on multi-CPU platforms (e.g., UNIX, Linux, and Windows™), and yet supports both the VHDL and Verilog languages in a single program such that the simulator can be used in any HDL design environments. The users do not need to maintain expensive workstations or separate VHDL and Verilog simulators to reduce product development costs.

Another object of the invention is to provide for a logic simulator that allows users to learn only one single simulator and yet be able to code their HDL designs in either VHDL and/or Verilog, which can be subsequently verified on any of the UNIX, Linux, or Windows™ platforms, to improve users' engineering productivity and shorten product development time and costs.

One more object of the invention is to provide for a logic simulator that allows users to easily import any design source files (e.g., intellectual property core logic design) from any third party design house and simulate such design source files with their own design regardless whether the third party design files are coded in the users' own HDL languages or not to further improve engineering productivity and to shorten product development time and costs.

Still one object of the invention is to provide for a unique new network-based simulation method to facilitate VLSI designers to make full use of their network resources to perform logic simulation. Specifically, the VLSI designers can treat all their networked (single- or multi-processor) machines as one giant computer, and to perform compilation and simulation of their designs on their local desktop computers or any other computers on the network. This method not only improves users' engineering productivity, but also improves the return of investment of users' hardware and software resources. This new method is not described or implemented in any prior arts.

In addition to all the above, one more object of the invention is to provide for a logic simulator that provides a simulation job scheduling method which allows users to schedule compilation and simulation of their designs on any remote or local (single- or multi-processor) machines, at their specified time(s). This feature allows large design groups to schedule and balance the workload of their network machines, as well as to define periodic regression testing of their VLSI designs. The job-scheduling feature is not described or implemented in any prior arts. As described above, this feature provides further benefits to improve users' engineering productivity as well as to users' return of hardware and software investments.

Finally, another object of the invention is to provide for a logic simulator whose multithreaded capability allows users to reduce drastically their simulation time on multiprocessor platforms to reduce development costs and time, and to improve engineering productivity and product quality.

SUMMARY OF THE INVENTION

This invention describes a novel concurrent, multithreaded algorithm to accelerate the execution of logic simulation of HDL (VHDL and/or Verilog) designs on any general-purpose multi-processor computer systems including, but without limitation to, UNIX, Linux, and Windows™ platforms. The algorithm enables the logic simulator provided by the invention to achieve a scalable performance (i.e., from linear to super-linear) according to the number of CPUs on the selected platform.

This invention describes further a novel HDL logic simulator that supports both VHDL and Verilog HDL design languages in a single program, and is multithreaded on any platforms. These features allow VLSI chip and/or system designers to mix-and-match their HDL designs (Verilog and/or VHDL) and run simulation on any hardware resources they have available.

One aspect of the invention is to provide for a novel HDL simulator that provides seamless access of network resources for HDL design compilation and simulation. Specifically, by installing a server program which runs on any of the remote workstations including, but without limitation to, UNIX, Linux, or Windows™, users can access design files on any of such machines directly from their respective computers, via a user-interface ("UI" or "UIs") program(s). Furthermore, the users can instruct (via their local UIs) remote servers to compile and/or simulate HDL designs on the server hosts. The remote compilation and/or simulation results are automatically transferred back to the user' local hosts and are displayed on their UIs.

Another aspect of the invention is to provide for a novel HDL simulator to provide simulation job scheduling on local and/or remote platforms including, but not limited to, UNIX, Linux, and Windows™. This features allow VLSI designers to balance the work loads on their network resources by scheduling simulation runs at off-peak hours, as well as to automate the regular regression testing of their designs.

TABLE 1

The Commercial Logic Simulators and their Properties

| Product | Vendor | HDL language | Platforms | MT | Sim |
|---|---|---|---|---|---|
| VCS | Synposys | Verilog | UNIX, Windows | No | Event |
| VSS | Synopsys | VHDL | UNIX, Windows | No | Event |
| Cyclon | Synopsys | VHDL | UNIX, Windows | No | Cycle |
| SpeedSim-MT | Synposys | VHDL | UNIX | Yes | Event |
| LeapFrog | Cadence | VHDL | UNIX, Windows | No | Event |
| Verilog-XL | Cadence | Verilog | UNIX | No | Event |
| Polaris | Avanti | Verilog | UNIX | Yes | Cycle |
| SpeedWave | Quickturn | Verilog | UNIX | Yes | Cycle |
| QuickHDL | Mentor | VHDL & Verilog | UNIX, Windows | No | Event |

Legend:
Event = Event-driven simulation.
Cycle = Cycle-based simulation
MT = multithreaded kernal.
Sim = simulation method

BRIEF DESCRIPTION OF THE FIGURES

FIG. 6 shows a sample state listing window used by either a event-driven or a cycle-based logic simulators to depict simulation results;

DESCRIPTION OF THE BACKGROUND TECHNOLOGY

Circuit Model for Logic Simulation

Figure 1:
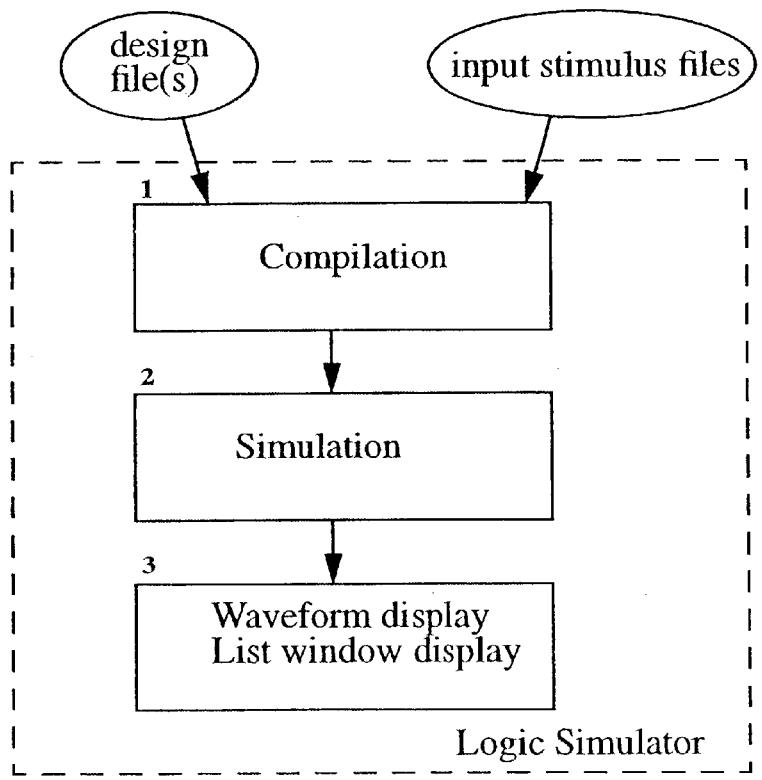
FIG. 1 describes the basic operations of a logic simulator and the input of data to the logic simulator from a user.
Figure 2:
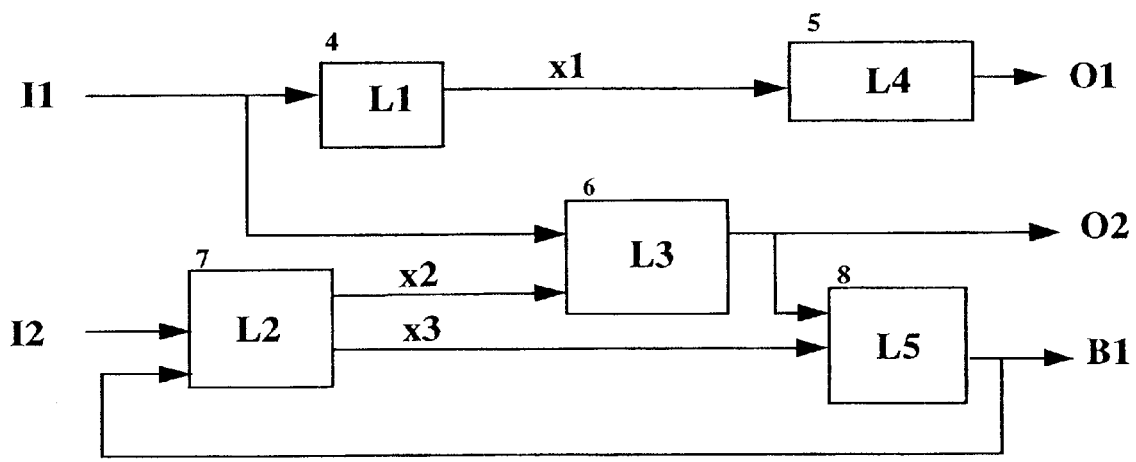
FIG. 2 depicts a circuit model used by a logic simulator to model a user design.

Referring to FIG. 2, there is shown a logic simulator that models a user design (i.e., a circuit) shown as a directed graph consisting of a series of "logic gates" and signals. The signals namely, I1, I2, O1, O2, B1, x1, x2 and x3, in the directed graph are named in accordance to on-chip buses in VLSI designs. The signals carry discrete logic values and may be single-bit or multiple-bits. The Logic gates, designated as boxes L1 4, L2 5, L3 6, L4 7, and L5 8 in FIG. 2, may be of different types to represent different logic functions in the VLSI design. For example, the L1 4 logic gate may be an adder, and the L2 5 logic gate may be a 4-bit counter, etc. Specifically, each logic component (e.g., a counter, a clock generator, or a memory module) in the user design is mapped to one or more logic gates, which are interconnected by the correspondent signals to reflect the actual connectivity of the logic elements in the user design.

For simulation, user-defined input stimuli are usually applied to the primary signals and bi-directional signals (e.g., I1, I2, and B1) of a circuit. When a signal changes state, its fanout logic gates will be evaluated. This evaluation may cause the fanout signal(s) of the logic gate to either changes state immediately or be scheduled to change states at a future time. The logic simulator can keeps track of these events propagation by using the directed graph.

Logic Simulation Algorithms

The logic simulation algorithms described hereunder are applicable to both event-driven and cycle-based logic simulators as well as to the concurrent execution of these logic simulation algorithms on multiprocessor workstations as provided by the invention.

Figure 3:
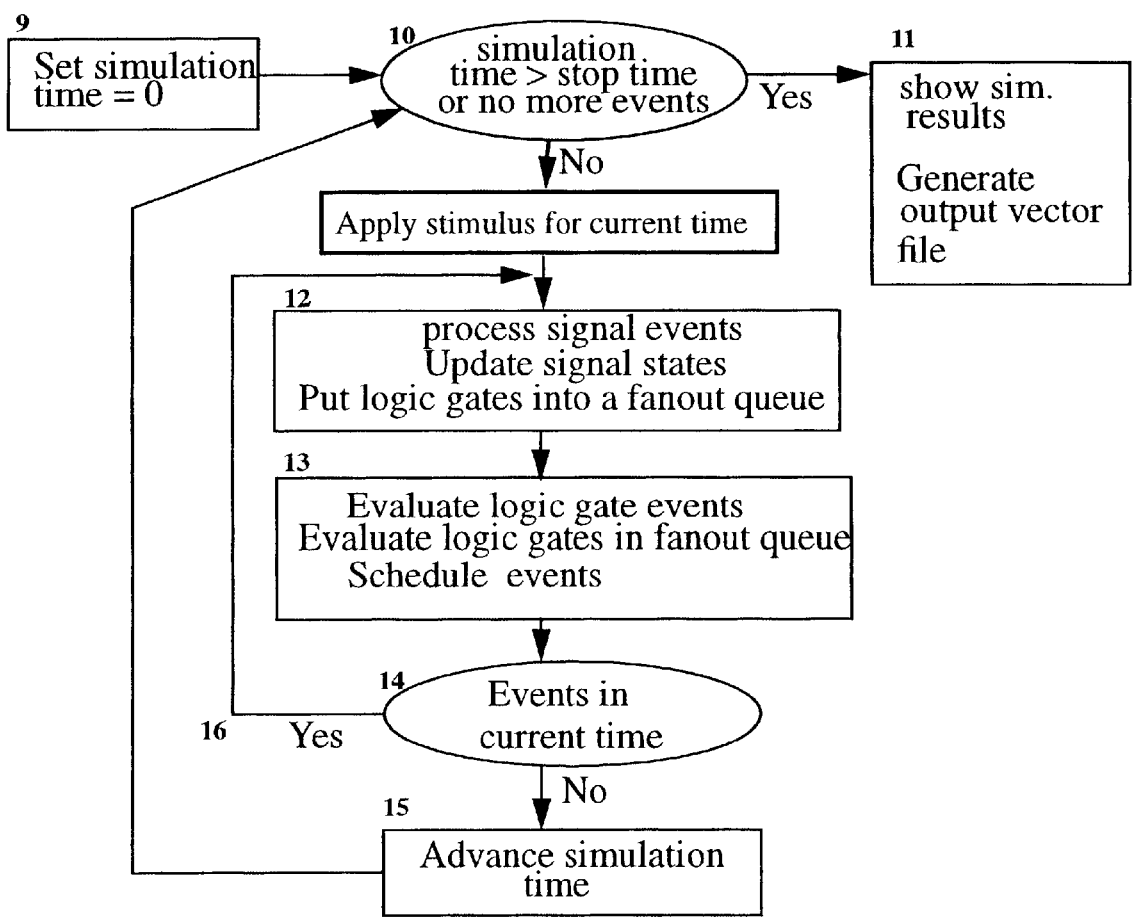
FIG. 3 illustrates a flow chart that describes a detailed event-driven logic simulation process which is an expansion of Box 2 in FIG. 1 to show that the flow is independent of which HDL language is used.
Figure 4:
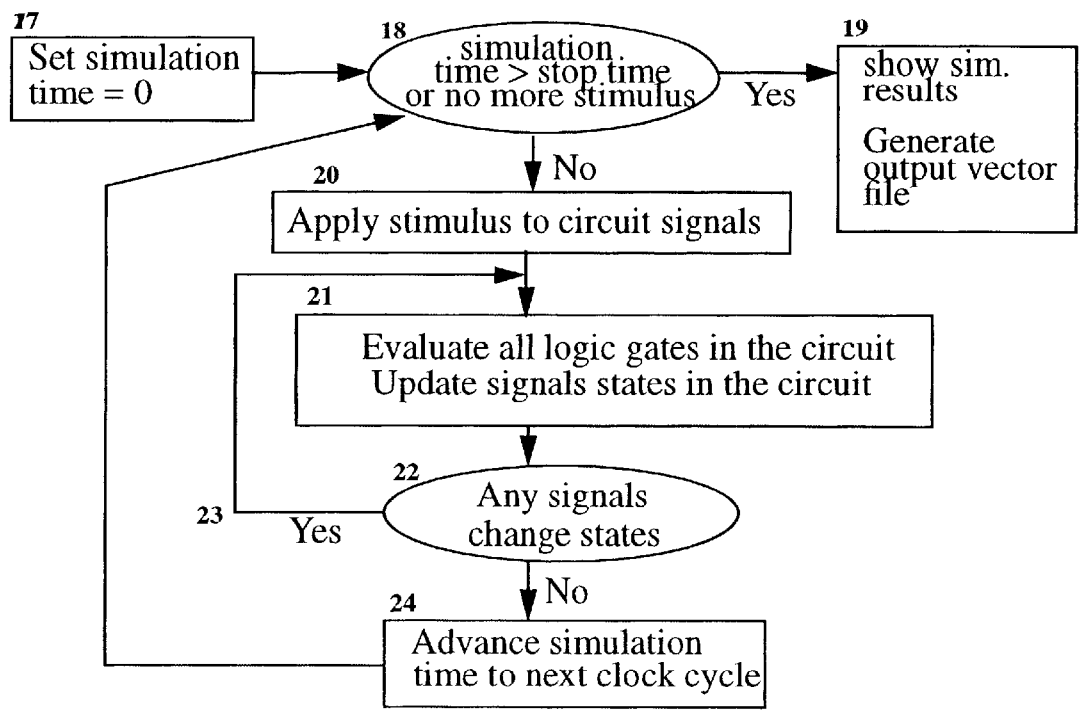
FIG. 4 describes a detailed cycle-based logic simulation flow as an expansion of Box 2 in FIG. 1 to show that the flow is independent of which HDL language is used.

Referring to FIGS. 3 and 4, there depict detailed logic simulation processes respectively for the event-driven and cycle-based logic simulators. Prior to performing any step illustrated in this flow, a user HDL design (either coded in VHDL, Verilog, or a combination of both) should have been compiled into the simulator database. Moreover, user-defined input stimuli for the simulation run should have also been loaded into the simulator memory.

Figures 21, 22:
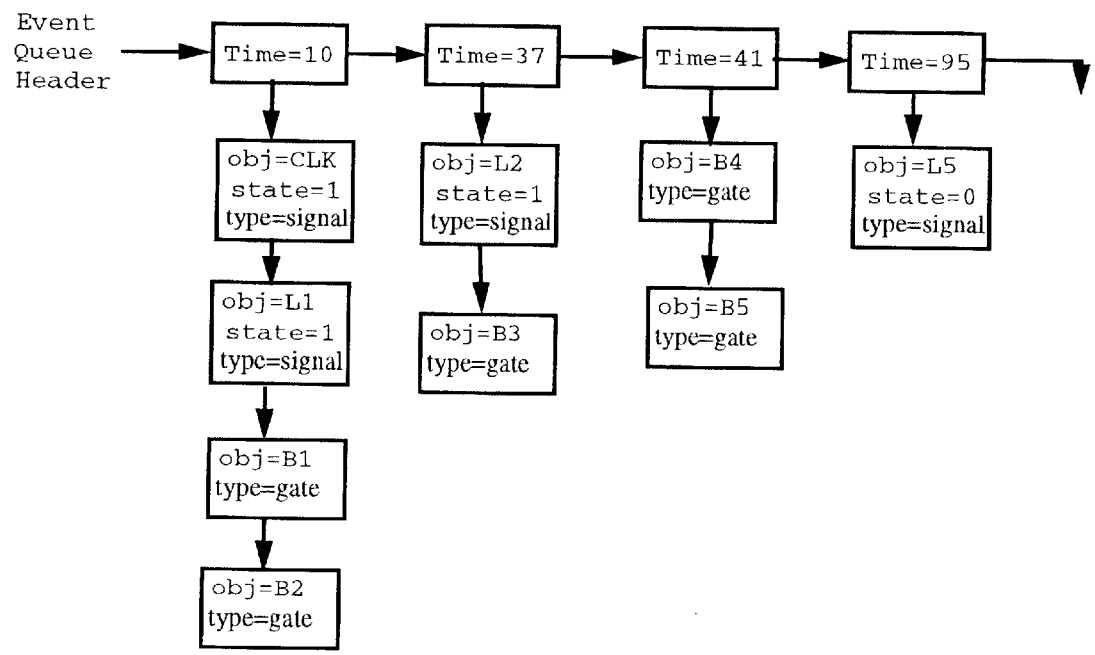
FIG. 21 shows an example event queue for event-driven logic simulation.
FIG. 22 shows a sample simulation vector file.

FIG. 3 illustrates the event-driven simulation process in which the input stimulus consists of new states to be assigned to the primary input and bi-directional signals (e.g., I1, I2, and B1 of FIGS. 2) of the design being simulated, at various simulation time points. The simulator schedules events for these selected signals to change states according to the stimulus specification. To manage these scheduled events, the simulator chains all events that are to be processed at the same simulation time point into a linked-list. A linked-list may contain both signal events and logic gate events. There may be multiple linked-list maintained by the simulator during simulation, and it sorts and stores all these linked-lists in a linear event queues, in increasing scheduled times (FIG. 21 shows an example of an event queue). The simulator removes each of these linked-lists from the queue in a first-in-first-out manner. It also advances the simulation time according to the scheduled time specified in each linked-list so processed.

Figure 5:
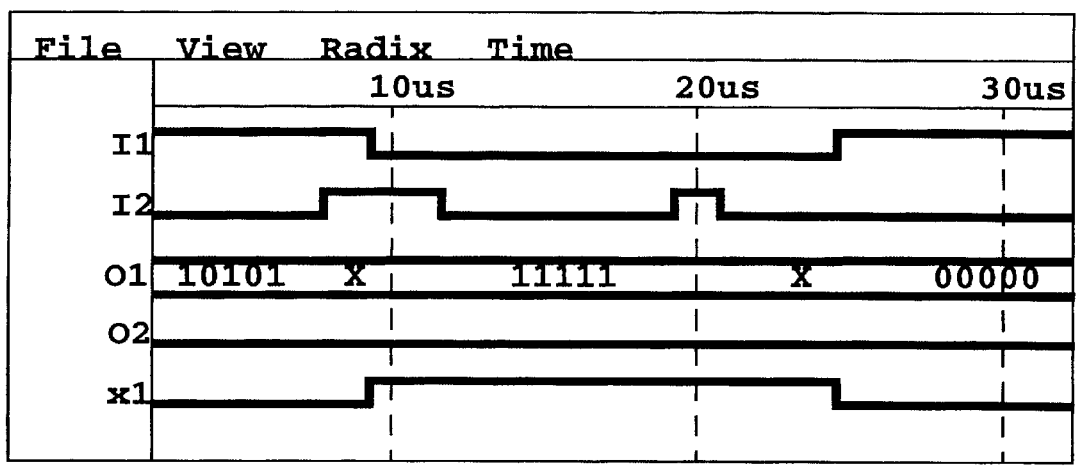
FIG. 5 shows a sample graphical waveform window used by either an event-driven or a cycle-based logic simulator to depict simulation results.

Referring to FIG. 3, the logic simulator begins simulation by setting the simulation time to 0 as indicated by a step 9. It then checks, as indicated by a step 10, if the current simulation time exceeds a user-specified maximum simulation run time, or if there is no event pending in the event queue. If all of the conditions indicated by the step 10 are true, the simulation is halt as indicated by a step 11, and the logic simulator will proceed to show the simulation results to users via a graphic waveform windows and/or a tabular state listing windows (see FIGS. 5 and 6). The simulator can also generate a hard copy vector file (see FIG. 22) to document the simulation results.

If the simulation time is less than the user-defined limit, and there are certain event(s) pending, the simulation proceeds to a step 12 by checking the event queue for any signal events and/or logic gate events pending for the current time. If there are signal events, the logic simulator will process the signal events first, and then it will process any logic gate events afterward.

Figure 23:
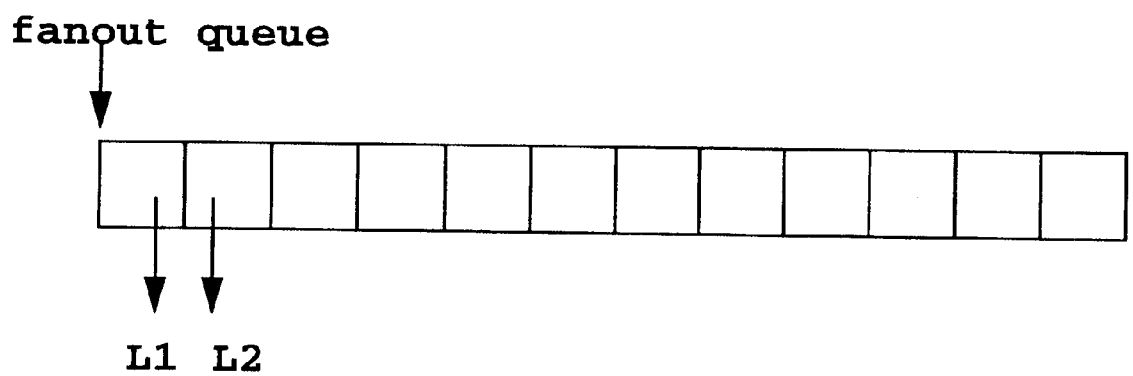
FIG. 23 shows an example fanout queue for event-driven logic simulation wherein the fanout queue is a linear array of pointers to logic gates to be evaluated.

The signal events are processed, as indicated by the step 12, by updating the specified signals' states to their new values, and also put their fanout logic gates either into a fanout queue for evaluation or to schedule them to be evaluated at some future times (i.e., as new logic gate events). The fanout queue (see FIG. 23) is a linear array that holds pointers to logic gates that are to be evaluated in the current simulation time (after all signal events are processed). The logic gates in the fanout queue are tagged, so that if multiple inputs of a logic gate change state at the current simulation time, the logic gate is put into the fanout queue once only.

The logic gate events are processed next, as indicated by a step 13, which includes evaluating logic gates specified in these events, and schedule any fanout signals of these logic gates to change states in future simulation times. Furthermore, some logic gates may need to be re-scheduled for evaluation in future times (for example, the logic gate may be a clock generator which drives a clock signal to change states in a fixed time interval) this will result in new logic gate events being put into the event queues.

After all logic gate events are processed, any logic gates stored in the fanout queue will be removed from the queue and be processed in the same manner as the aforementioned logic gate events.

When all signals and logic gates are processed, the simulator will check the event queue to determine if there are still any (zero-delay) signal and/or logic gate events need to be processed as indicated by a step 14. If there are still such events remained to be processed, the simulation iteration repeats by going back to the processing of these events as indicated by a step 16 until these events are processed through the steps of 12, 13, and 14.

Referring back to the step 14, if there are no zero-delay events remained to be processed for the current time, the simulator advances the simulation time to the next event-pending simulation time, as indicated by a step 15, which causes the simulation cycle to be repeated by reverting the process to the step 10 to check the simulation stop conditions.

FIG. 4 illustrates the cycle-based simulation process in which the input stimuli consist of new states to be assigned to circuit signals at each clock cycle. The simulator does not schedule events for these stimuli; instead it reads and applies the stimuli vectors sequentially at the start of each clock cycle.

For cycle-based simulation, the simulation process is similar as that described for event-based simulation above except that there is no event queue need to be processed. In every simulation cycle, the logic simulator begins simulation by setting the simulation time to 0 as indicated by a step 17, it then checks, as indicated by a step 18, if the current simulation time exceeds a user-specified maximum simulation run time, or if there is no more stimulus left. If any of the conditions indicated by the step 10 is true, the simulation is halt as indicated by a step 19, and the logic simulator will proceed to show the simulation results to users via a graphic waveform windows and/or a tabular state listing windows (see FIGS. 5 and 6). The simulator can also generate a hard copy vector file, which contains the simulation results (see FIG. 22).

If the simulation time is less than the user-defined limit, and there is stimulus vector pending, the simulation proceeds to a step 20 wherein the simulator will apply the input stimulus for the current clock cycle, and then evaluates all logic gates in the circuit design at repeated iterations, until no more signals change states as indicated in steps 21, 22 and 23. The simulator then advances the simulation time to the next clock period as indicated in a step 24, and repeats the simulation cycle by reverting the process to the step 18.

Multiprocessor System

Figure 7:
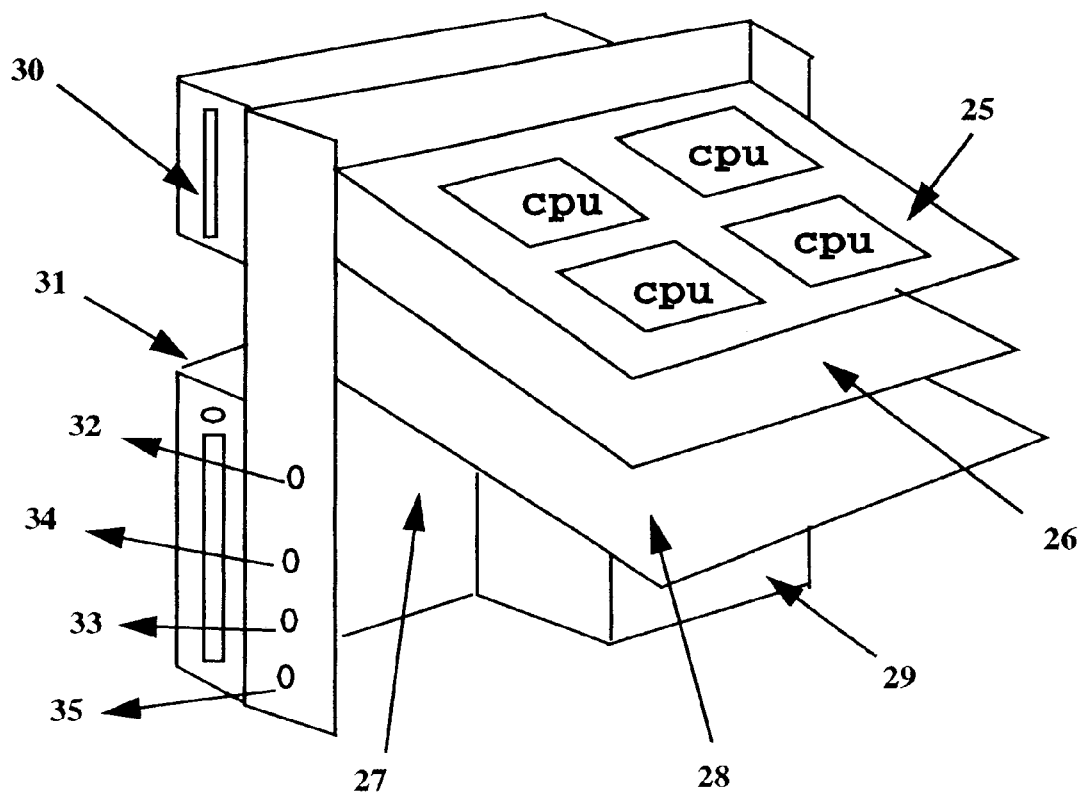
FIG. 7 shows a typical configuration of various system components of a multiprocessor system that can run either UNIX or Windows™ operating system.

FIG. 7 depicts a typical multiprocessor system. The multiprocessor system comprises one or more CPU boards 25. Each of the CPU board hosts two or more CPU chips, cooling fans, and second-level cache memory. The number of CPUs on any multiprocessor system should be in multiple of two (i.e., a system may have two CPUs, four CPUs, or eight CPUs, etc). All CPUs on a multiprocessor system are usually of the same brand/model and run at the same speed. Except for their dedicated second-level cache memory and cooling fans, all CPUs on a multiprocessor system share all other resources: main memory 26, system bus system 27, floppy, video, mouse and hard-disk controller, etc 28–35.

The multiprocessor system also contains other components that are the same as any single-processor system. These include a hard-disk drive 29, floppy disk drive 30, CDROM drive 31, and external device controllers such as keyboard 32, printer 33, mouse 34 and modem 35.

A multiprocessor system may run UNIX, Windows™, Linux, or any other operating systems that support symmetric multiprocessing (SMP). SMP means the operating system that can assign an equal amount of operating tasks to all CPUs on the system, so that the system can run multiple jobs concurrently.

When a non-multithreaded application is run on a multiprocessor/SMP system, it will be treated as one operating task by the operating system. It will not be executed concurrently on multiple CPUs and hence its performance will not be improved over that on a single-CPU system. A multithreaded application, on the other hand, can run its separate threads on multiple CPUs concurrently. Thus a multithreaded application's performance can be accelerated on a multiprocessor/SMP system. In a multithreaded application, there may be a thread that controls the execution of all other threads. The controlling thread is called the "master thread". The other threads that are controlled are known as the "slave threads". The "master thread" and "slave threads" are used herein to describe the methods for multithreaded logic simulation according to the invention and should have the above-defined meanings.

In the rest of this specification, the term "multiprocessor systems" represents any commercial multiprocessor/SMP systems.

DETAILED DESCRIPTION OF THE INVENTION

1. Multithreaded HDL Simulator Uses Single Program for VHDL and Verilog Design Verification This invention discloses a new logic simulator that supports both the VHDL and Verilog design languages for both event-driven and cycle-based simulation in a single program, and uses multithreaded methods to accelerate the simulator's performance on multiprocessor platforms. These features aid users to cut down the development time by not having to learn a new HDL language in order to use the simulator. In addition, it allows the users to mix-and-match HDL design files from different design groups (in the company) or from vendors, and yet be able to accelerate their simulation on multiprocessing systems.

Table 2 lists the major commercial HDL simulators and their features as compared to the invention. Note that none of the prior art simulators has the ability to support both VHDL and Verilog languages in a single multithreaded application. Moreover, none of the prior art simulators is capable of providing an application that can run on th e UNIX, Linux, and Windows™ platforms.

TABLE 2

Comparison of the invention with major Commercial Logic Simulators

| Product | Vendor | HDL language | Platforms | MT | Sim |
|---|---|---|---|---|---|
| VCS | Synposys | Verilog | UNIX, Windows | No | Event |
| VSS | Synopsys | VHDL | UNIX, Windows | No | Event |
| Cyclon | Synopsys | VHDL | UNIX, Windows | No | Cycle |
| SpeedSim-MT | Synopsys | VHDL | UNIX | Yes | Event |
| LeapFrog | Cadence | VHDL | UNIX, Windows | No | Event |
| Verilog-XL, NC | Cadence | Verilog | UNIX | No | Event |
| Polaris | Avanti | Verilog | UNIX | Yes | Cycle |
| SpeedWave | Quickturn | Verilog | UNIX | Yes | Cycle |
| QuickHDL | Mentor | VHDL & Verilog | UNIX, Windows | No | Event |
| Invention | | VHDL & Verilog | UNIX, Linux, and Windows | Yes | Both |

Legend:
Event = Event-driven simulation.
Cycle = Cycle-based simulation
MT = multithreaded kernal.
Sim = simulation method (A) Simulator Supports Both the VHDL and Verilog Languages in a Single Program The logic simulator that supports both the VHDL and Verilog languages in a single program according to the invention is discussed. Specifically, the logic simulator (event-driven and cycle-based) has separate compilers for the VHDL and Verilog source files. When the simulator compiles a user-specified HDL source file, it will pre-examine the file content to detect automatically the coded file language. It will then invoke an appropriate compiler to process that file. Thus, unlike other prior art, the simulator provided by the invention does not require a special program invocation switch, nor does it require feature makes the simulator easy for user to use, and is less error pro n e for operation.

Since the VHDL language is case-insensitive, whereas the Verilog language is case-sensitive, when users compile multiple design files coded in a combination of both of these two languages, they need to specify a program invocation switch to instruct the simulator that either the Verilog compiler should convert all design object names into the same case as that used by the VHDL compiler, or that the VHDL compiler should preserve object names. This is needed so that the simulator can resolve signals or logic gate names that are referenced in a VHDL source file but defined in a Verilog file, or vice versa. This program switch is, however, not needed if users are compiling either VHDL-only or Verilog-only source files.

Since VHDL supports a smaller set of logic states than verilog, for mixed-language designs the simulator will automatically map VHDL signal states to Verilog signal states.

This approach has been found adequate for most ASIC (Application Specific Integrated Circuit) and FPGA (Field Programmable Gate Array) designs. However, if users need more control on the logic states mapping between the two languages, they can specify a configuration file which describes such mapping, and instruct the simulator to read that configuration file, before it compiles any HDL design files. Specifically, in the configuration file, users will specify how each IEEE std. 1164 MVL9 (multi-value logic level) state (for VHDL) is mapped to which signal state(s) in Verilog. Furthermore, if users define their own data types in their VHDL design files, they can specify in the configuration file how to map those user-defined states to Verilog signal states.

When compiling user's HDL design files, any signal in the design that connects a VHDL logic gate and a Verilog logic gate will be modified by the compiler to pass through a state conversion "logic gate". During simulation, this logic gate will perform state conversion function between VHDL states and Verilog states according to either t he simulator's default mapping or user-defined mapping.

To accomplish the aforementioned purposes the simulator compiles VHDL and/or Verilog design files into a common database to which the event-driven and cycle-based logic simulation will be performed. After a design is compiled, users may instruct the simulator to compile the IEEE-defined SDF (Standard Delay File) files to back-annotate post-physical layout delay timing data to the design in the database. Like compiling mixed language design files, users may use the same program invocation switch to instruct the invention SDF compiler to either preserve the letter cases in the SDF file (if the database was compiled to be case sensitive), or to ignore cases in the SDF file (if the database was compiled to be case insensitive).

(B) Multithreaded Simulation For VHDL and Verilog Designs

Once users' VHDL and/or Verilog designs have been compiled into the simulation database, they are being processed by the same multithreaded simulation engine. Thus, the simulation of VHDL-only, Verilog-only, and mixed VHDL and verilog designs are accelerated in the same manner.

(C) Special Logic Simulation Algorithms on Multiprocessor Systems

Figure 8:
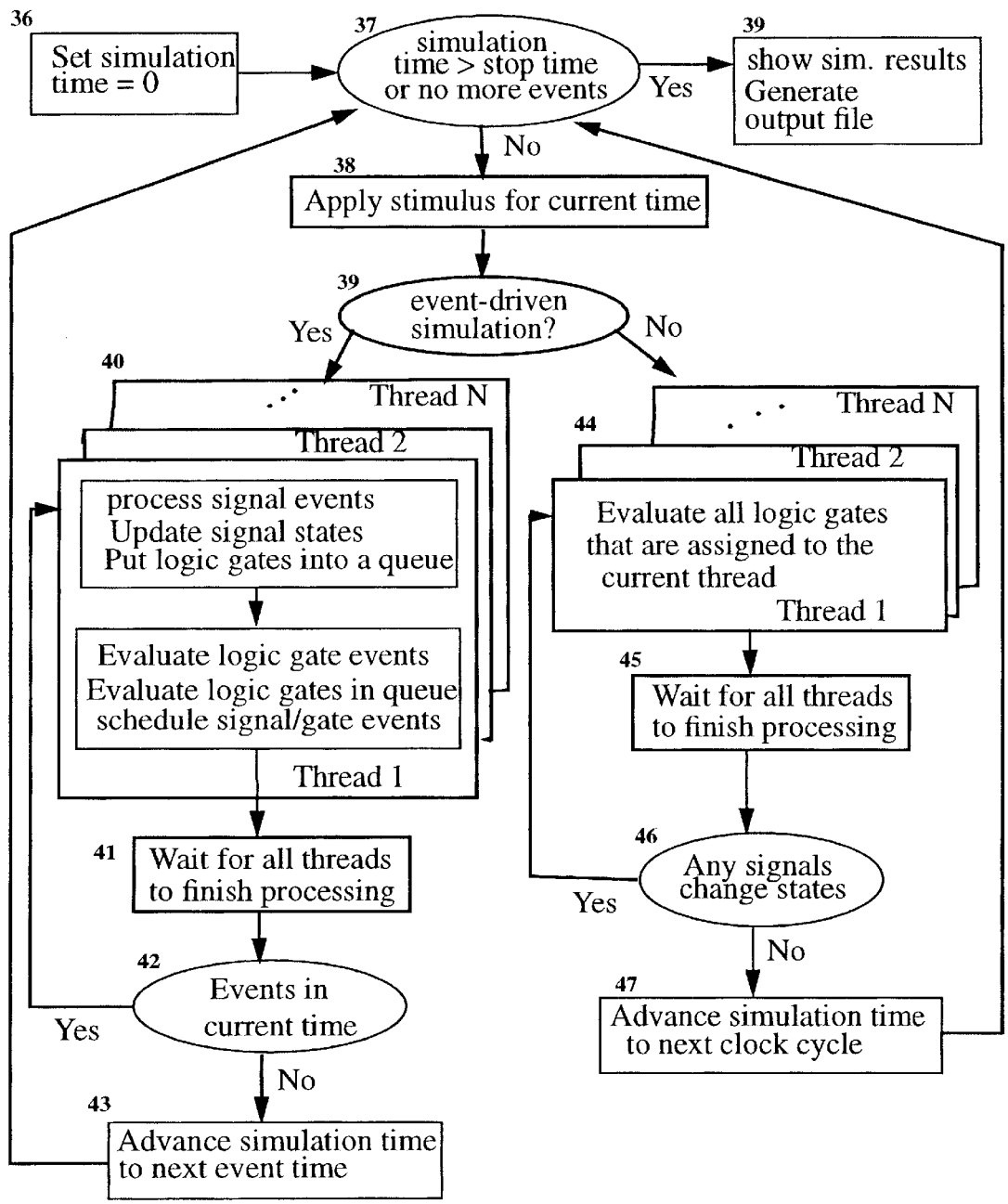
FIG. 8 shows the logic simulation algorithms (event-driven and cycle-based) modified for multiprocessor systems.

Referring to FIG. 8, there is shown a new logic simulation process flow for event-driven and cycle-based simulation on multiprocessor systems according to the invention. The objective of this new logic simulation algorithms is to accelerate the simulation process to reduce product development time and costs for users.

As stated above, the basic logic simulation algorithms on a multiprocessor system are similar to that on a single-CPU system for event-driven and cycle-based logic simulation, as shown in FIGS. 3 and 4 (i.e., as compared to those steps shown in 36, 37, 38 and 39, in FIG. 8), except the processing of signals and logic gates on a multiprocessor system are modified. The objectives of these modifications are to maximize concurrency and minimize thread synchronization overhead in the simulation process. These modifications and their benefits are described in more detail later.

(i) The modification to Event-Driven Logic Simulation

Referring to FIG. 8, the event-driven logic simulation on a multiprocessor system according to the invention is modified to process multiple signals concurrently rather than serially by multiple threads as shown in a step 40, which run concurrently on multiple CPUs. Specifically, a thread in parallel with the others can do the updating of an individual signal state. Then, each signal's fanout logic gates are pushed into a per-thread specific fanout queue (steps 40 and 41). These fanout logic gates and any logic gate events for the current simulation cycle will be evaluated by each thread concurrently. Once all threads have completed processing their assigned signals and logic gates events, a master thread will check if there are further (zero-delay) events to be processed in the current simulation cycle (step 42). If there are, the simulation iteration repeats the steps 40–42, or the master thread advances the simulation time to the next event/clock cycle time (step 43), and starts a new simulation cycle (step 37).

When logic gates are processed concurrently by multiple threads, any new signal or logic gate events that are generated from these evaluation are scheduled in a per-thread specific event queue, and the event records are allocated from the per-thread specific heap memory region. In this way, there is no thread synchronization overhead in scheduling events for future simulation time points.

(ii) The Modification to Cycle-Based Simulation

Figures 9, 10:
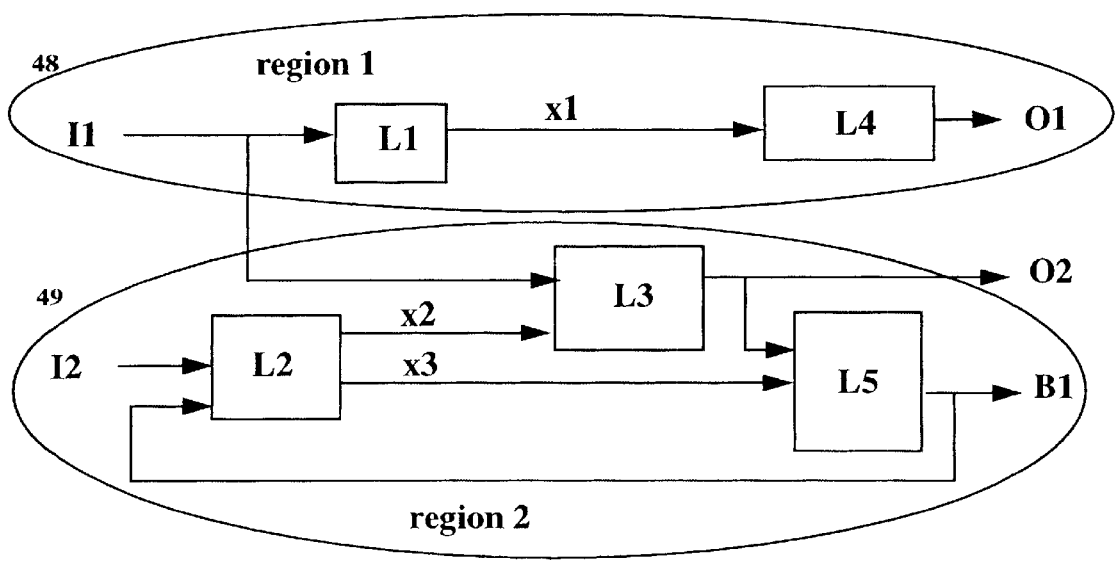
FIG. 9 shows the partition of a circuit into different regions from which each of the regions is simulated by a separated thread in a cycle-based logic simulator.
FIG. 10 shows a sample clock definition file for cycle-based logic simulation wherein users may optionally specify certain logic regions be processed using cycle-based, and the rest of the circuit will be processed using event-driven method.

Referring jointly to FIGS. 8 and 9, the cycle-based logic simulation on a multiprocessor system according to the invention is modified to process multiple signals concurrently rather than serially by multiple threads.

As illustrated in FIG. 9, the simulator will partition the circuit being simulated into different regions (48 and 49). Each region will consist of signals (ie., I1, x1 and O1 in region 48 and I2, x2, x3, O2 and B1 for region 49) and logic gates (i.e., L1 and L4 in region 48 and L2, L3 and L5 in region 49), and is assigned to be processed by a dedicated thread. Thus, during simulation, all threads are processing different regions of the circuit, and there are minimum interactions among threads. However, since interface signals between regions may change states after the regions have been evaluated. Thus there is a need for cycle-based simulator to repeatedly evaluating logic gates in all regions within any simulation cycle, whenever there are inter-region signals that change states.

Specifically referring back to FIG. 8, at the start of each clock cycle, the master thread will wake up all slave threads to begin evaluating all logic gates in their dedicated logic regions (step 44). Logic gates in each regions are ranked, such that all logic gates near the inputs of a region are evaluated first (e.g., L1 in region 48, and L2 in region 49, of FIG. 9), then their fanout logic gates are evaluated next (i.e., L4 in region 48, and L3 and L5 in region 49, of FIG. 9), and the process continues for subsequent logic levels, until all logic gates in the regions are evaluated. This method ensure most input signals of a logic gate are updated, before the logic gate is being evaluated.

When a logic gate is evaluated, if any of its output signals change states, the change will occur immediately because cycle-based simulation does not model propagation delays in circuits. When all threads are done processing their logic regions, the master thread will check if any interface signals between regions have changed states (step 46 of FIG. 8). If there are, the master thread will instruct all the slave threads to repeat the evaluation of their regions (steps 44–45). Otherwise, it will advance the simulation time to the next clock cycle time, and starts a new simulation cycle (steps 47 and 37).

(iii) To Support Both Event-Driven and Cycle-Based Logic Simulation in a Single Program The compilations of HDL design files are the same for both event-driven and cycle-based simulation. The simulator also uses the same design database for both event-driven and cycle-based simulation. However, prior to running cycle-based simulation, users must specify to the simulator the clock signal(s) that are to be used to define the clock cycle periods for the simulation run. Users can specify these clock signal names (and optionally their clock cycle periods, if they are to be different from those described in the HDL files) in a text file and specify that file's path name to the simulator, via a program switch, when invoking the simulator. During simulation, at each simulation cycle the tool will check if there are clock signals defined and it will perform cycle-based simulation accordingly (steps 44–47 of FIG. 8) or otherwise, it will perform event-driven simulation (steps 40–43 of FIG. 8).

As illustrated in FIG. 10, there is shown a sample clock definition file for cycle-based logic simulation. Users may optionally define the "Cycle=" statements in this file to specify logic regions which are to be processed using cycle-based, and the rest of the circuit will be processed using event-driven method. For example, the statement "Cycle=(CLK, L1, L2)" means all logic regions driven by the CLK signal, and those that contain the L1 and L2 logic gates will be processed using cycle-based method. While other logic regions will be processed using event-driven method.

Accordingly, it is now possible to perform mixed event-driven and cycle-based simulation on a circuit according to the invention. Users can specify to the simulator (via the clock definition file) that some logic components in their circuits are to be evaluated using event-driven method, while other components in their circuits are to be evaluated using cycle-based manner. In this situation, the compiler will partition the circuits into event-driven logic regions and cycle-based logic regions. Then during simulation, each thread will examine their assigned region type, and performs either event-driven or cycle-based simulation on their regions, accordingly.

Figure 11:
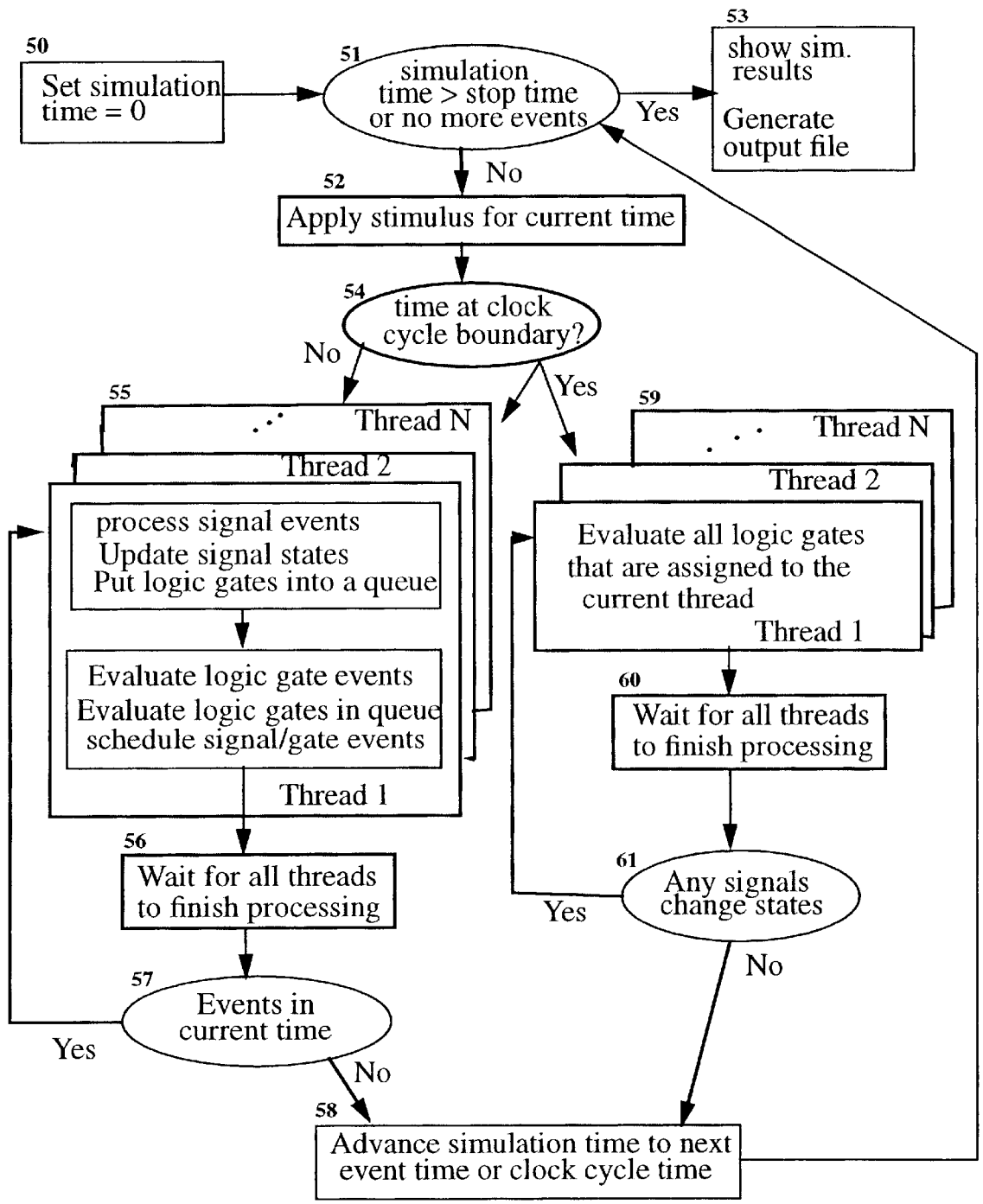
FIG. 11 shows the logic simulation algorithm for mixed event-driven and cycle-based simulation on a multiprocessor system.

FIG. 11 shows the modified simulation process flow for the mixed event-driven and cycle-based simulation on a multiprocessor system. The simulation process is similar to that described in FIG. 8 except for certain modifications. Note that cycle-based logic regions are evaluated at user-specified clock cycle boundaries only (step 54), whereas event-driven logic regions may be executed more often than their cycle-based counterparts. Thus at the beginning of each simulation cycle (step 54 of FIG. 11), the master thread will check if the current time is at the beginning of a clock-cycle boundary. If it is not, it will invoke threads to evaluate event-driven regions only (steps 55–57 of FIG. 11). Otherwise, it will invoke threads to process both event-driven and cycle-based regions. Threads for cycle-based regions will evaluate logic gates in their assigned regions (steps 59–60 of FIG. 11), whereas threads for event-driven regions will do work only if there are events in their event queue for this clock cycle time (steps 55–57). In addition to the above, at the end of each simulation cycle (step 58 of FIG. 11), the master thread will advance the simulation time to either the next event time or clock cycle time, whichever comes sooner.

2. Multithreaded HDL Simulator Supports Seamless Access of Network Resource for HDL Design Compilation and Simulation One unique feature provided by the invention is to use a distributed client/server architecture to allow users to compile and simulate their HDL designs on either local or remote machines on the Internet or intranets such that the users can perform remote logic simulation without the need of any internetwork tools like telnet, or rexec programs. The local and remote machines suitably employable may be UNIX, Linux, or Windows™-based machines or other platforms. The advantages of this feature is to allow users to maximize the use of their hardware resources and to receive the return on investment of their hardware and software system, to improve engineering productivity to cut down time and costs.

Figures 12, 13:
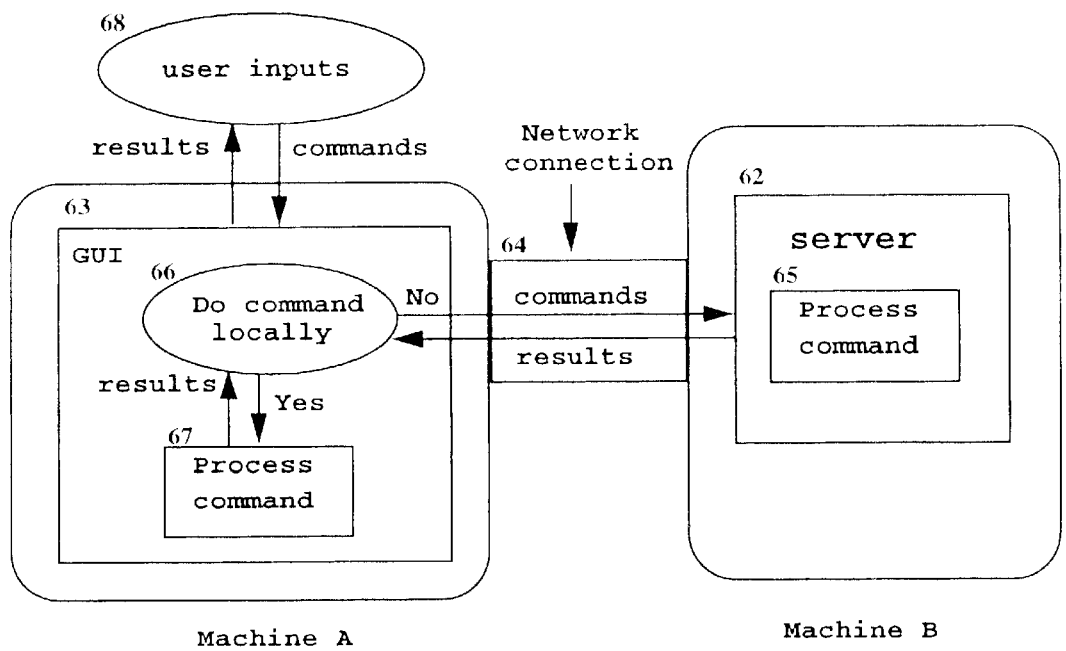
FIG. 12 shows the use of a UI program to connect to a remote server (running on a different machine) via a local area or wide area network to pass user's commands server program.
FIG. 13 shows a sample UI window for scheduling simulation job.

Referring to FIG. 12, to support remote compilation and simulation, the users need to install a server or a server program 62 provided by the invention on the respective machines networked with the Internet or Intranets. Once the server program 62 is installed, the users then run a UI (user interface) program 63 on their local hosts. This UI program 63 allows the users to specify a remote machine name, and a remote directory pathname, on which they desire their HDL design compilation and/or simulation to be performed. If the users do not specify these parameters, then they are default to the local machine and to the current work directories of the users. As such, for local processing, users' HDL design compilation and/or simulation will be processed and displayed locally in accordance with steps 66 and 67. If a design is compiled and/or simulated on a remote hosts, the UI program 63 will open a network connection 64 to the server process on each user-specified host, and then transmits the user's commands to the server to be executed at the user-specified directory 65. After the commands are executed, any console output and/or simulation results are automatically transferred back to the users' UI program 63 for display. In addition to all that, the users can also use the UI program 63 to browse any compiled design databases that are resided on local or remote machines.

The remote simulation capability allows users to treat any network machines in the same manner as their local machines. Thus, the users can readily share and use design data that are scattered on the Internet or intranets to save times and improve productivity by eliminating the need for manually copying files across machines or the need for physically logging-on to remote machines to run simulation.

To use the network-based computing feature, the users only need to install and run the server program 62 on any remote hosts to which they are connected or to which they wish to have access. Server hosts and users local hosts can be of different platforms, and may be connected via the Internet or Intranets.

The UI program 63 and the server program 62 according to the invention may communicate using any network transports and operating system supported interface functions. The latter includes using the Sun Microsystems Inc. Java™ Remote Method Invocation (RMI), sockets, Corba, DCOM, remote procedure calls, or any other methods.

For example, the server program 62 registers a set of functions that can b e called by the UI program 63 via the RMI. These functions include (1) compiling a HDL design file in a specified directory; (2) simulating a design residing in a specified directory; (3) displaying a database content in a specified directory; (4) showing the server version number, and local host information; and (5) transferring a file to/from the UI. Furthermore, the server program registers its name with the RMI naming service program on its local host so that the server can run continuously on a remote host listening for the UI service requests.

On the user host (the client side), when a user specifies a remote host name and a remote directory pathname (in the UI menu) for compilation or simulation (step 68 of FIG. 12), the UI 63 will contact the remote host RMI naming service to obtain a handle for the server by specifying the registered name of the server. If the UI obtains the handle successfully, it will use it to call the server's remote functions. However, if the UI 63 cannot get the handle for a remote server, it will report to the user that an attempt to connect to a server on the specified host failed.

The server 62 provides a few functions that can be invoked by the UI 63 to transfer large files over the network. Specifically, any simulation results are stored in a file and are transferred from the server host to a UI host for display to the user. Furthermore, if a user wishes to compile a design on a remote host, but the design file is not on that remote host, the UI program 63 will instruct the server 62 to first obtain the design file before compilation.

Specifically, if a user is running a UI on host X, and he wishes a server on host Y to compile a design file that is on host X, the UI will first call the server on host Y to receive the design file and store it into a temporary file, then the UI will call the server a second time to compile the temporary file on the server host. The server will delete the temporary file once it completes its compilation. This is to avoid duplication of design files on network machines and causes confusion to users of which copy of the design file is the latest.

As another example, if a user on host X instruct the UI to invoke a server on host Y to compile a design file that is resided on host Z, the UI will first contact the server on host Z to transfer the design file into a temporary file on host X, then it will call the server on host Y to receive the design file, and then compile it. This process could be modified such that the UI can instruct the server on host Y to copy the design file directly from the server on host Z, and then compile the file. This will save time and avoid creating a temporary file on host X. However, the user may (and often does) wish to view/edit the compiled design file on host X, thus it makes sense for the UI to make a local copy of the design file on host X. Furthermore, the current method also eliminates the need for the servers to communicate with each other, and thus reduces the invention code complexity.

In addition to providing compilation and simulation functions, the server according to the invention also provides some RMI functions that return the server version number and the server host name and workload information. This can be used by the UI to inform users of the status of remote server hosts. The users can use the information to select the latest version of remote servers and/or those running on hosts with the lightest workload.

No prior art provides the similar remote simulation capability as aforementioned. Furthermore, no prior art has used the Sun Microsystems Inc. Java™ RMI method for any network-based logic simulation.

3. Multithreaded HDL Simulator Provides and Supports Simulation Job Scheduling

Referring now to FIG. 13, the UI according to the invention further provides a sophisticated menu for users to define, query, modify, or delete simulation jobs. Specifically, a user may define one or more jobs, such that each job instructs the UI to launch HDL compilation and/or simulation of designs on a local or a remote machine, at the user-specified time(s). Furthermore, the users may instruct the UI to repeat the job on a regular time interval (e.g., weekly, or daily). This benefits users by improving engineering productivity and cut down development time and costs.

In addition to the above, a user may also instruct the UI to log events, send emails on the status of a job to a list of users, and/or to execute other shell commands (system commands or shell scripts) at the completion of a scheduled job. Consequently, this job-scheduling feature is very useful for large design teams to carry out regression testing of their new releases at regular period. Moreover, it allows designers to balance the use of their network machines by scheduling simulation to run at non-overlapping hours on each machine Under the current industry practice, for comparison purposes, users that use UNIX or Linux machines may write their own cron jobs to schedule simulation events. This method requires the users to code and debug their cron files, which is timing consuming and error-prone. In addition, the cron job scheduling is not supported by the Windows™ platform. Using the simulator provided by the invention, however, the users will find that it is much more efficient and less error prone to define simulation jobs. Furthermore, this feature is available across the UNIX, Linux, Windows™ (95/98/NT) or other platforms.

Figure 14:
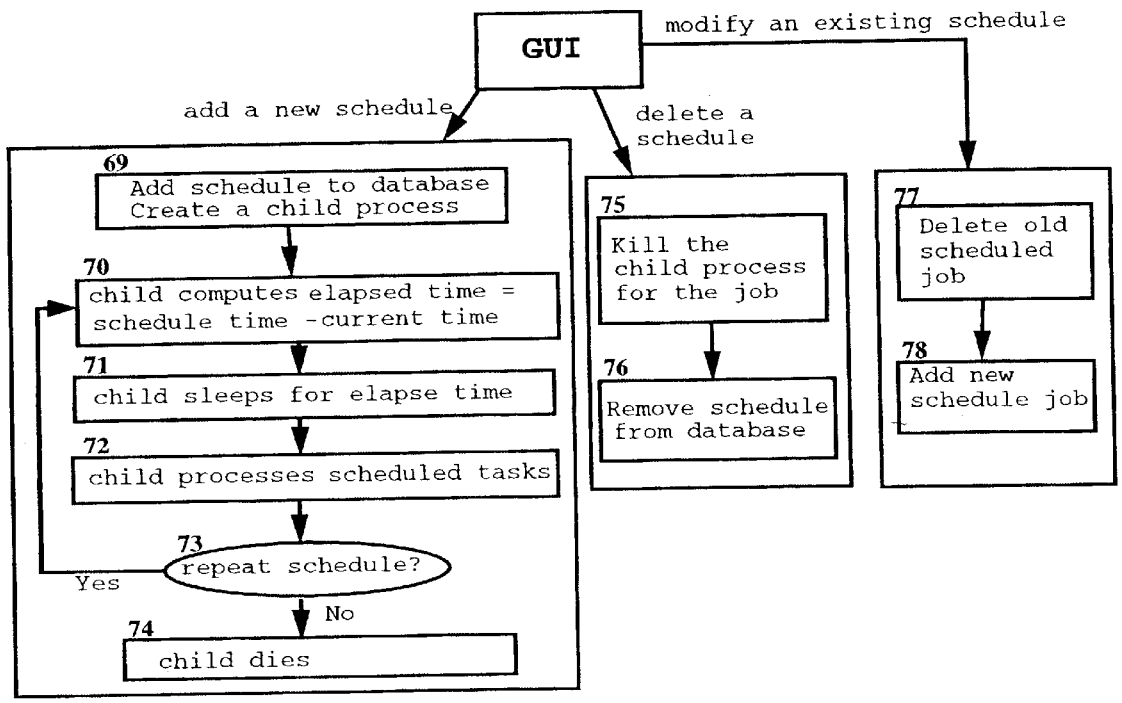
FIG. 14 shows the process flow for handling of simulation job schedules.

Referring to FIG. 14, to implement the job scheduling functions, the UI compiles all user-defined jobs into a binary "job description" file. This file is stored in a private directory. For each user-defined job, the UI will create a child process to handle that job. For each newly added user-defined job, the UI will create a child process to handle that job (step 69 of FIG. 14). The child process will run independently from the UI, and it will terminate when the target job has been completed.

Specifically, when the child process starts up, it will record its process identification number to a job entry in the "job description" file. It then computes elapsed time, which is the difference between the schedule time and current time 70, and goes into a "sleep" mode 71 and wakes up only at the user-specified schedule time. For example, if a user defines a job at 10 pm, and specifies that the job is to be executed at 12 am of the next day, the child process will sleep for 2 hours and then wake up to process the job. When the child process wakes up, it executes the job in accordance with the user specification 72. If the job is to compile/simulate a design on a remote host, the child process will contact a remote server to perform such functions, in the same manner as the UI does. After the job is completed, the child process will record in the job entry of the "job description" file that the job has been executed, and it will perform any post-processing operations (e.g., sends emails to users, executes user-defined shell commands, and/or logs the job execution event to a file). After that, if there are still other schedule time(s) for the job, the child process will go back to sleep 73. Otherwise, it will terminate itself 74.

It should be noted that the use of the aforementioned method instead of creating cron jobs for job scheduling has provided many advantages over the prior art. One notable advantage is that the method eliminates the need for cron supports and therefore makes job schedule applicable to the Windows™ platform, which generally does not support cron jobs. Furthermore, this method provides a preferred alternative for users to schedule simulation jobs on UNIX and Linux systems previously relying on the cron files because corn files are used system-wide on those systems by all users including those performing functions unrelated to job schedule, thus it may be undesirable to modify the cron files as it may adversely affect the abilities of the UNIX and Linux systems to perform other functions.

In the event that a host is rebooted and the invocation server is restarted, it will automatically read the "job description" file. If there are jobs yet to be executed but their correspondent child processes are no longer running, the server will create new child processes to handle these jobs. In this way, the job scheduling will remain intact despite that the system has been rebooted.

The job scheduling functions provided by the invention also allow a user to cancel a scheduled job via the UI. Specifically, a user can identify a scheduled job by name, and instructs the UI to delete the job. The UI will first find the child process that is associated with the job and kills the child process 75. The UI then removes the corresponding job description file in its private database 76.

The job scheduling functions provided by the invention also allow a user to modify a scheduled job (e.g. change the HDL files to be compiled, or the simulation run options) via the function of UI program. Specifically, he will first instruct the UI to bring up the menu for the scheduled job (see FIG. 13), edits the menu, and then clicks the "OK" button. Once the menu is closed, the UI will first delete the existing scheduled job 77 and add new scheduled job 78 followed by creating a child process to reschedule the job (steps 69–74 of FIG. 14).

No prior art offer any job scheduling capability.

4. Advanced Concurrent Algorithms to Ensure Superior Scalability of Simulation Performance on Multiprocessor Computer Systems Beside modifying the basic logic simulation (event-driven and cycle-based) for multiprocessor systems, special features are provided to further accelerate the simulation process on multiple CPUs concurrently so that the simulator according to the invention can consistently out-perform other simulators for event-driven and cycle-based simulation. Specifically, when a user runs a multithreaded tool on a n CPU system (where n>1), he would expect that the performance of the tool should improve by C * n times, where C is an empirical constant as follows:

$$0.5 >= C <= 1$$

For example, if C is 0.75, then the expected speedup of a multithreaded tool on different configurations of a multiprocessor system are:

| Number of CPU | Speedup |
|---|---|
| 2 | 1.5 times |
| 4 | 3.0 times |
| 8 | 6.0 times |

Where the speed up of a multithreaded tool is computed as:

Speedup (x)=Performance on a multi-CPU system/Performance on a single-CPU system If the C factor of a multithreaded tool remains at 1.0 on different number of CPU configurations, the tool is said to demonstrate a linear scalability. If the C factor of the tool is less than 1.0, then it is said to demonstrate a sub-linear scalability. Finally, if the C factor of the tool is above 1.0, then it is said to demonstrate a super-linear scalability. It is generally possible for a multithreaded tool to demonstrate sub-linear scalability on some test cases, and linear or even super-linear scalability on other test cases. If a tool consistently demonstrates linear to super-linear scalability on most test cases it processes, then it can be classified as a linear/super-linear scalable tool. Otherwise it is classified as a sub-linear scalable tool.

Table 3 below depicts the scalability benchmark results of the simulator provided by the invention as performed on a Sun UltraSparc™ (250 Mhz, 10-CPU, Solaris 2.6) platform (i.e., the size is measured in number of logic gates in a test circuit; the times are measured in CPU seconds; and K=1024).It becomes apparent from these results that the simulator according to the invention will be classified as a linear/super-linear HDL simulator.

TABLE 3

The scalability Benchmark Results of the multiprocessor systems provided by the invention

| Ckt: | size | 1-CPU | 2-CPU | 4-CPU | 8-CPU |
|---|---|---|---|---|---|
| test1 | 100 K | 48.32 sec | 20.83 sec (2.3x) | 10.53 sec (4.6x) | 4.97 sec (9.7x) |
| test2 | 250 K | 374.49 sec | 164.67 sec (2.3x) | 110.98 sec (3.4x) | 59.77 sec (6.3x) |
| test3 | 50 K | 32.45 sec | 17.49 sec (1.9x) | 10.32 sec (3.2x) | 5.23 sec (6.2x) |
| test4 | 20 K | 18.57 sec | 9.72 sec (1.9x) | 6.07 sec (3.1x) | 3.31 sec (5.6x) |

The simulator achieves linear and super-linear scalability by using special new concurrent methods that are described in the following sections. These methods are designed to maximize concurrency in the HDL simulation process, and to minimize the overhead in manipulation of multiple threads running on multiple CPUs concurrently. This renders superior and scalable HDL simulation performance. Furthermore, the methods are applicable for both event-driven and cycle-based logic simulations. The new concurrent methods used by the invention have not been described or implemented in any prior art.

(A) Methods to Minimize Threads Manipulation OverHead

Thread manipulation overheads include the time spent in creation and destruction of threads, to schedule threads to bind to hardware CPUs for execution, and to wait for threads to complete their execution by other threads. Finally, if some global data that may be concurrently accessed by multiple threads, then those threads must be synchronized so that none of the threads can modify those data if any one of more of the other threads are currently reading or modifying those data. Synchronization of the threads increases the simulation time.

In general, the thread manipulation overheads increase exponentially as more threads are used in a process. Thus, to ensure the multithreaded simulator provided by the invention capable of minimizing these overheads, a variety of following methods are employed: (1) use as few threads as possible during the simulation process and minimize the frequency of thread creation and destruction; (2) minimize the number of shared data to be accessed by multiple threads to minimize the time needed to synchronize threads; and (3) keep the threads "alive" and be bound to hardware CPU as long as possible to minimize the time spent in scheduling threads for execution.

To reduce the number of threads employed in a process upon which n CPUs are available on a platform, the simulator will allocate exactly n threads (one master thread and n-1 slave-threads) at program starts up. Each of these threads will be set as a real-time thread and be scheduled by the operating system directly to bind to a hardware CPU throughout the entire simulation run. No other threads will be created during the simulation run. Thus, there is very little overhead in creating threads and to keep track of which threads are alive. Furthermore, by using a minimum number of threads in a process, it also reduces the memory needed to support the process execution. This results in less swapping/paging of the simulator process by the operating system.

Contrary to the invention, it is a common practice for the prior art simulators to allocate n+1 threads (one master thread and n slave threads) on an n-CPU system. The master thread's main function is to manage the execution of the slave threads to perform simulation. In this invention, however, the master thread will spend only a minimum amount of time managing the slave threads, and it shares an equal amount of workload with the n-1 slave threads to carry out the simulation. The invention approach has the benefits of reducing the idle time the master thread needed to spend in waiting for the slave-threads to complete their tasks. Moreover, there is one less slave-thread with which the master thread needs to synchronize its process execution. All these, alone or added together, help to reduce the thread manipulation overheads.

Figure 15:
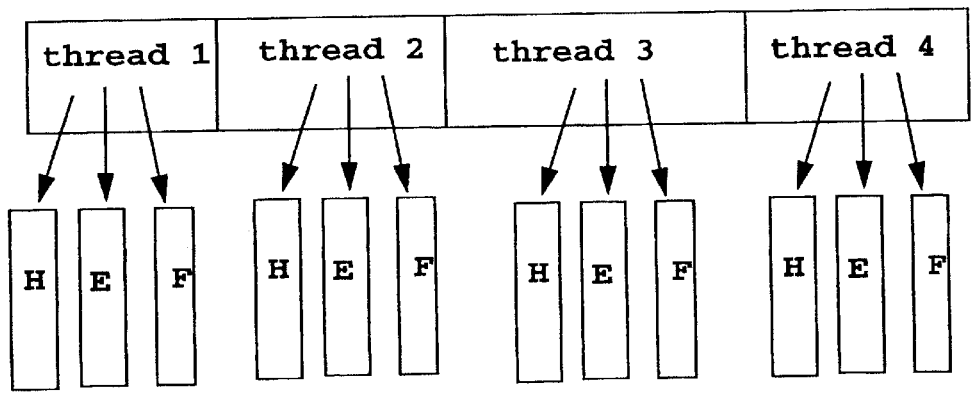
FIG. 15 shows thread-specific private data to minimize thread manipulation overheads.

To minimize the number of shared data used by threads, each thread maintains a private heap memory region (designated as "H" in FIG. 15), an event queue (designated as "E" in FIG. 15, and a fanout queue (designated as "F" in FIG. 15). Thus, there is no need to synchronize threads when adding or deleting signals or logic gate events during a simulation. This saves a lot of thread synchronization overhead, as the most frequently used operations in a HDL simulation are memory allocation/deallocation, add fanout logic gates to a fanout queue(s), and add/deleting signals and logic gate events (for event-driven simulation).

Specifically, each thread is allocated a block of heap memory at program startup. During simulation, whenever a thread needs to allocate memory (e.g., add an event for a signal or a logic gate) it will allocate memory from its private heap memory region. The same process also applies for deallocating a dynamic data record. When a thread uses up its allocated heap memory, it will allocate another block of heap memory from the process heap region (this process will involve thread synchronization).

When a thread updates a signal state and assigns its fanout logic gates to a fanout queue, it uses its private fanout queue and tags each logic gate in its fanout queue with a per-thread specific identification number. Thus, if two or more threads put the same logic gates into their private queues in the same simulation cycle, the logic gate will be tagged with one of those threads identification number only (the ID of the last thread that put the logic gate into its queue). When each thread processes logic gates in its fanout queue, it will check to match the logic gates' tags with the thread's identification number. If any of them do not match, the thread will not evaluate those logic gates. This method avoids thread synchronization when adding logic gates to threads' fanout queues, while also eliminates any chances of duplicated evaluation of logic gates in the same simulation cycle. These benefits are important, as they not only save simulation time, but also prevent two or more threads from evaluating the same logic gates concurrently and cause un-predictable simulation results.

In event-driven simulation, signals and logic gate events as generated by an individual thread will be added to the thread's private event queue. There is no need of thread synchronization in such an operation. At each simulation cycle (see steps 37, 38 and 39 of FIG. 8), the master thread will scan the n event queue and either processes all events (for the current time) itself if there are only a few events, or uses the slave threads to process events that are in their own private queue. It has been observed that by using thread-specific event queue and heap memory region, the simulator performance has been improved by up to 25% on most test cases.

The n-1 slave threads when they are not performing simulation tasks, they will be blocked by a per-thread specific synchronization object (e.g., a semaphore). When the master thread wants to wake up the slave threads, it will change the state of the synchronization object of each thread to unblock them. The threads will then be scheduled to bind to the hardware CPUs and start doing work. These operations are time consuming, especially the simulation cycle may repeat million of times on long simulation.

Figure 16:
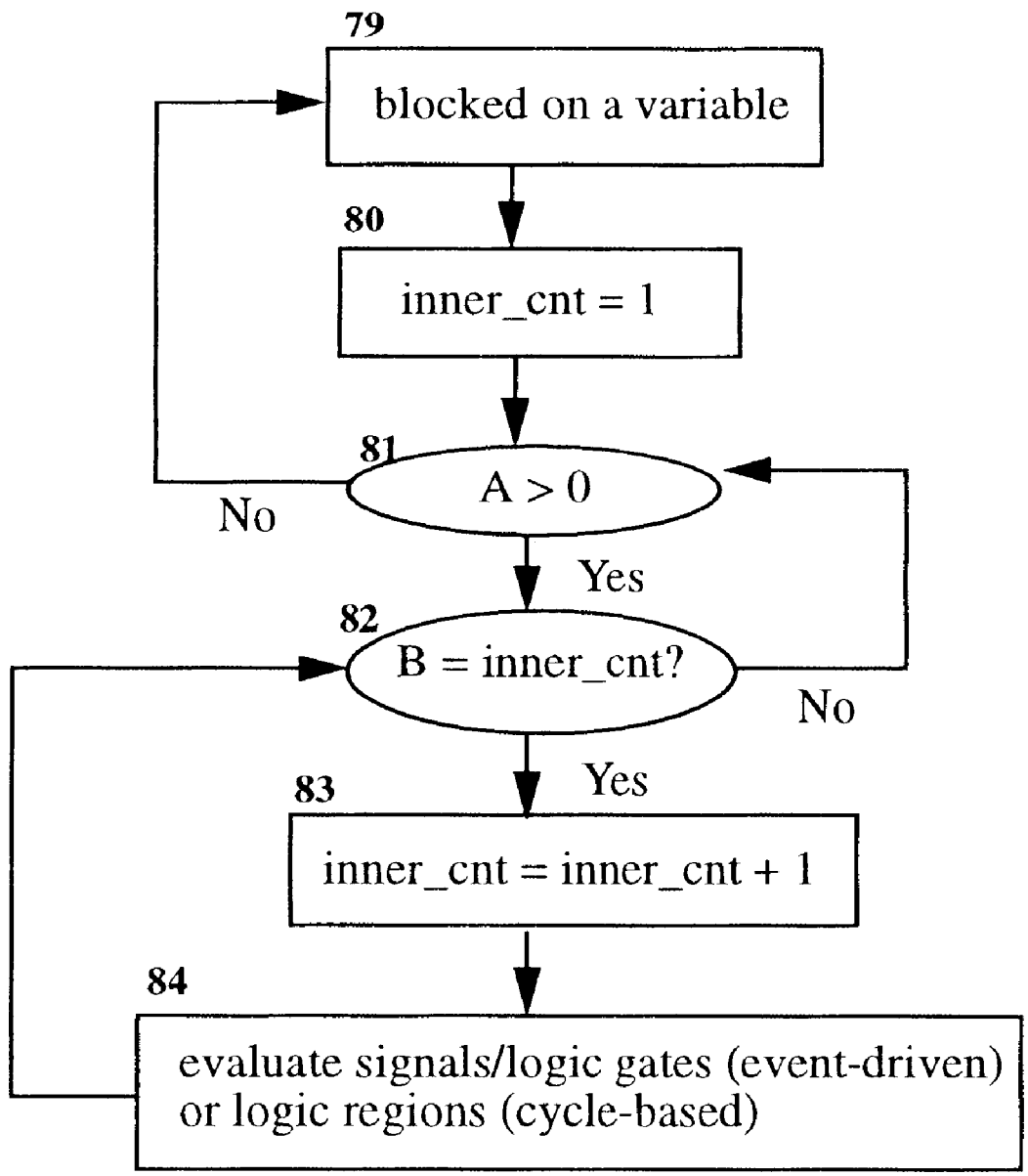
FIG. 16 shows the process flow of a function to be executed by multiple threads concurrently in logic simulation wherein the threads are blocked by conditional variables.
Figure 17:
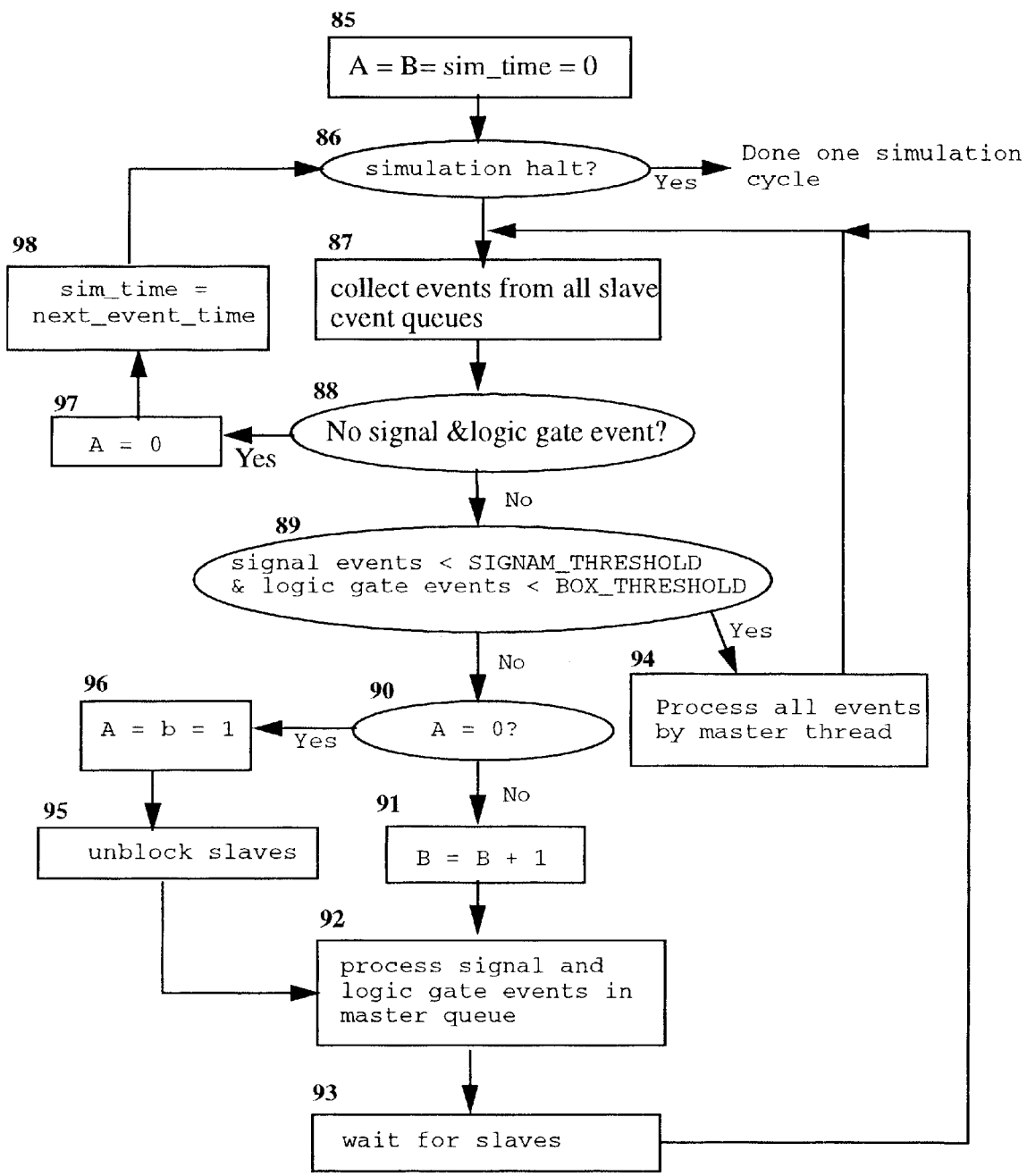
FIG. 17 shows the process flow of an event-driven simulation algorithm as executed by a master thread.

The process flows of the multithreaded event-driven simulation, as executed by the master thread and slave threads, are depicted in FIG. 17 and FIG. 16, respectively. The process flows of the multithreaded cycle-based simulation, as executed by the master thread and slave threads, are depicted in FIG. 18 and FIG. 16, respectively.

For both event-driven and cycle-based simulation, to minimize the slave thread activation overheads, the invention uses synchronization objects to block slave threads only at the beginning of each simulation cycle (step 79 of FIG. 16). Specifically, slave threads are blocked by some system variables (e.g., condition variables on UNIX and Linux platforms, or event objects on Windows™ platform), and the master thread can unblock all slave threads (step 95 of FIG. 17, and step 101 of FIG. 18) by one system call (e.g., the pthread_cond_broadcast function call on UNIX and Linux platforms, and the pulse_event function call on Windows™ platform). This is more efficient than if the master thread needs to change each thread's synchronization object state individually.

Whenever the slave threads are unblocked, their operations will be controlled by two global variables A and B (steps 81 and 82 of FIG. 16). These two global variables are managed by the master thread (see FIG. 17 and FIG. 18) and their values are tested by the slave threads to determine their appropriate actions.

Figures 18, 19:
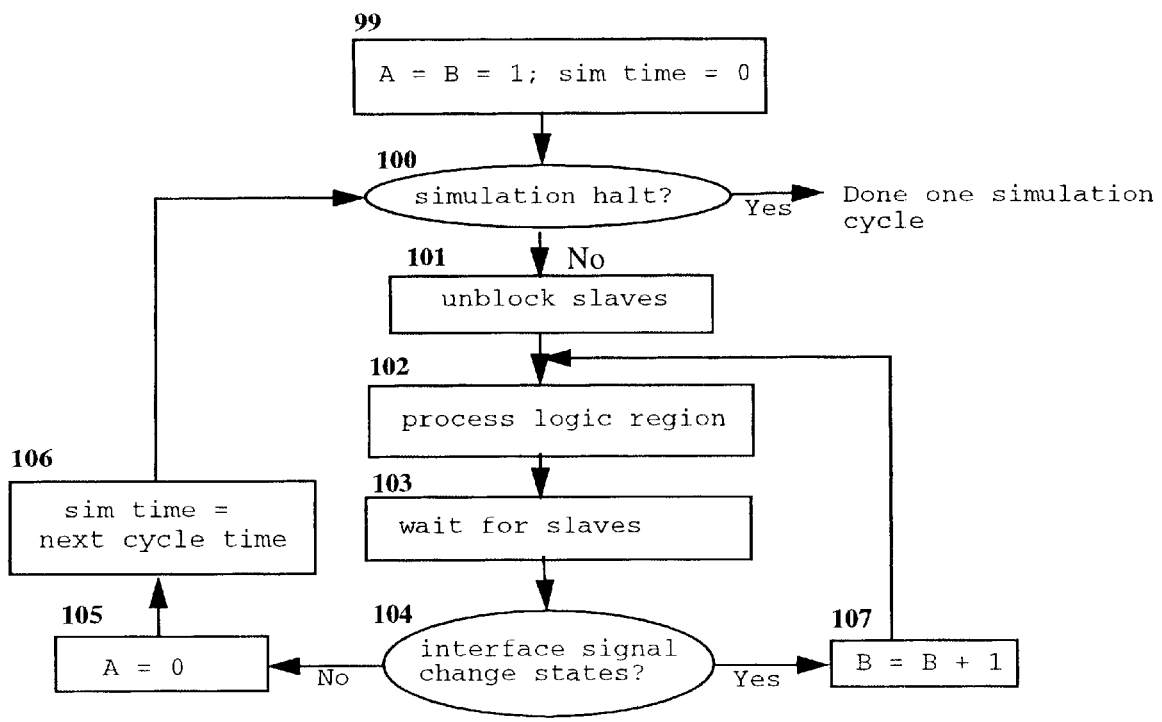
FIG. 18 shows the process flow of a cycle-based simulation algorithm as executed by a master thread.
FIG. 19 shows the pseudo code of a function to be executed by multiple threads concurrently in logic simulation using SWAP.

Specifically, in each simulation cycle, prior to waking up the slave threads, the master thread will set both variable A and B values to 1 (step 96 of FIG. 17 and step 99 of FIG. 18). As long as the variable A's value stays at 1, it tells the slave threads to remain "alive" and be ready to process the simulation inner loop (steps 81–84 of FIG. 16).

The variable B is used to tell slave threads when to start execution of the simulation inner loop. Specifically, this variable is set to 1 by the master thread, and each slave thread also maintains a private variable (inner_cnt 80 in FIG. 16), which is also set to 1 when the slave is unblocked (step 80 of FIG. 16). Thus in the first iteration of a simulation cycle, the slave threads will find both variable A and B values are 1 and they will process their first simulation inner loop. When that is done, the slave threads will spin on waiting either A or B variable to change values (steps 81 and 82 of FIG. 16).

At the end of each simulation inner loop, if the master thread determines that there are sufficient events (signals and/or logic gates) to be processed by the slave threads (step 88 of FIG. 17), or there are interface signals between logic regions have changed states (step 104 of FIG. 18), it will increase the variable B value by 1 (step 91 of FIG. 17 and step 107 of FIG. 18). This will in turn launches the slave threads to execute one more simulation inner loop (steps 82–84 of FIG. 16). However, if the master thread determines that there is no more processing needed for the current simulation time, it will just set variable A value to zero (step 97 of FIG. 17 and step 105 FIG. 18), this will cause the slave threads to exit the inner loop processing and go back to being blocked by their synchronization objects (step 79 of FIG. 16).

The use of the A and B variables are to keep the slave threads "alive" and be bound to hardware CPUs, so that there is less need to wake them up via synchronization objects. Since there may be quite a few simulation inner loop iterations per one simulation cycle, by blocking the slave threads only once per one simulation cycle via synchronization objects, it helps to reduce the overall simulation run time by more than 10%.

As stated above, the multithreaded simulator provided by the invention can be operated in several different platforms. By way of example, but not by way of limitation, if the Sun Sparc™ platform is used as the multiprocessor, it provides a special SWAP instruction code which does atomic addition or subtraction of an integer variable that may be shared by multiple threads. This SWAP instruction code can be used instead of synchronization objects to speed up the program. This is accomplished by allocating each slave thread a private integer variable that is initially set to 0. All slave threads will spin on waiting their private variable to change value. When the master thread wishes to activate the slave threads to start a simulation cycle, it will use the SWAP instruction code to set the per-thread private variable to 1. The slave threads will be "unblocked" from their spin loop and will reset their private variable back to zero (for the next simulation cycle). The slave threads will then process the simulation inner loops subject to the control of the global variable A and B. The pseudo code of a function using the SWAP instruction code of the Sun Sparc™ platform is illustrated in FIG. 19.

The use of SWAP code is much more efficient than manipulating conditional variables, and it also allows the slave threads to be "alive" and be bound to the hardware CPUs throughout the simulation. It has been observed that by using this method, the simulator reduces its simulation overhead by another 20%.

At the end of each simulation inner loop, the master thread needs to wait on the slave threads to complete their execution (step 93 of FIG. 17 and step 103 of FIG. 18), before it can start the next simulation inner loop or a new cycle. There are different methods on different platforms for the master thread to wait for the slave threads.

For example, on the Windows™ platform, each slave thread will set a (per-thread specific) synchronization variable (e.g., semaphore) when it completes its assigned work. The master thread will use the WaitForMultipleObjects system function to wait for all the n−1 slave threads semaphores to change states. On the Sun Sparc™ platform, each slave thread has its own private integer variable set by the SWAP code when it has completed its assigned work. The master thread will wait until the private variables of all of the slave threads are set to 1. Finally, on other platforms, each slave thread will set a bit in a global variable when it has completed its assigned task, and the master thread will wait/test this variable to be set to a pre-defined pattern.

The above methods have been empirically determined to be the most efficient means to activate/synchronize threads in concurrent processing of simulation events.

(B) Methods to Maximize Concurrency in the Simulation Process

To maximize concurrency in event-driven simulation, the master thread always need to check the number of events (signals or logic gates) to be processed at each simulation iteration. Referring to FIG. 17, the master thread will check if the number of objects to be processed is less than a threshold value 89. If the number of objects is found to be less than the threshold value, the master thread will process those events itself 94. On the other hand, if the number of events or objects exceeds the threshold value, then the master thread will "wake" up the slave threads. The slave threads and the master threads will work together to process objects concurrently. The concurrency is therefore selectively employed according to circuit activities.

It should be noted that the threshold values are different for signal events and logic gate events. For signal events, the threshold value is n/2 (where n is the number of CPUs available on the platform on which the simulator is executing). For logic gate events, the threshold value is n. These threshold values are empirically determined and seem to yield the best simulator performance for most test cases.

Specifically, at each simulation iteration, the master thread will check the n-event queues at such simulation iteration. If there are n/2 or more event queues containing signal events to be processed, or there are more than n logic gate events to be processed, the master thread will wake up the slave threads, and each thread will process any signal and logic gate events in its private event queue. However, if there are less than n/2 event queues containing signal events and there are less than n logic gate events to be evaluated, the master thread will process all those signal and logic gate events itself.

In addition to the above, each thread (slave or master) maintains its own private heap memory, event queue, and fanout queue. Thus each thread can perform its own work with minimum interaction with the other threads. This improves the concurrency of the simulator provided by the invention. In addition, each thread is designed to execute certain functions capable of performing a significant amount of work such that the time spent by each thread to execute such functions will always exceed the time it takes to activate the thread. Specifically, when processing a signal event, a thread will update the signal's state, and then either schedules the signal's fanout logic gates to the event queue, or be put to the thread's fanout queue for subsequent evaluation. For logic gate events, a thread will evaluate each logic gate, and then schedule any fanout signals of the logic gates to the event queue, or to take on new state immediately.

Another technique used by the invention to maximize concurrency is based on the observation that some signals (e.g., clocks, global reset or preset signals) in a circuit may drive large number of fanout logic gates. Thus, whenever these special signals change states, they will cost a significant amount of simulation time for scheduling their fanouts for evaluation. It is therefore advisable to make a special processing for such signals to speedup their processing. Accordingly, the compiler provided by the invention will recognize and mark any signals with more than a specified number of fanouts as "special". Consequently, during simulation whenever a "special" signal changes state, the master thread will invoke the slave threads to "process" (either to schedule or to evaluate) an equal amount of the signal's fanout logic gates concurrently.

For example, the compiler provided by the invention is configured to mark any signals with more than n * 1.5 (where n is the number of CPUs available on the platform on which the simulator is executing its functions) fanouts as "special". This seems to give the best simulator performance on most test cases. It has been observed that by implementing this special concurrent handling for the "special" signals, the simulator's performance has been improved by over 10%. It is further noted that the aforementioned techniques have not been described nor implemented by prior art simulator.

(C) Dynamic Data Structure to Minimize Events During Simulation

Besides using multiple threads to speed up HDL simulation, the performance of a HDL simulator can be also improved by minimizing the number of events that need to be processed.

Specifically, the compiler provided by the invention analyzes each user design and creates an internal network capable of minimizing events that may occur during simulation. This unique approach helps speed up the simulator performance significantly.

For example, if a logic gate in a design has five inputs, but only two of the five inputs trigger it, the simulator will remove the logic gate from the fanout list of the three un-triggering inputs. Thus, no matter how frequently these three inputs change states during simulation, the simulator will not evaluate the logic gate with respect to the three un-triggering inputs. However, if any trigger input(s) of the logic gate changes state, the invention will use the latest values of all the five inputs to evaluate the logic gate. No prior arts have described or implemented the aforementioned technique.

(D) Event-driven Cycle-based Logic Simulation

Most of the concurrent processing technique aforementioned can be applied to both event-driven and cycle-based simulation. However, in cycle-based simulation there is no need for event queue and fanout queue. The assumption is that, when using cycle-based simulation, the design being tested is synchronous. Since there are lots of events happening in the circuit at the start of every clock cycle, it makes sense to evaluate all logic gates in the circuit concurrently in equal amount by all threads per each clock cycle.

The drawback of the above assumption is that, even for a fully synchronous design, not all logic gates need to be evaluated at each clock cycle. For example, referring back to FIG. 9, if the signal I1 changes state in a clock cycle, then only the logic gates L1 and L3 need to be evaluated in the first simulation iteration. The logic gates L4 and L5 may not be subject to evaluation until in the second simulation iteration. As for the logic gate L2, it is absolutely unnecessary to be evaluated.

It is therefore highly desirable to minimize the number of logic gate evaluation in a cycle-based simulation to improve simulation speed further. This can be achieved by incorporating the event-driven technique into the cycle-based simulation algorithms to further speed up the simulator performance.

Figure 20:
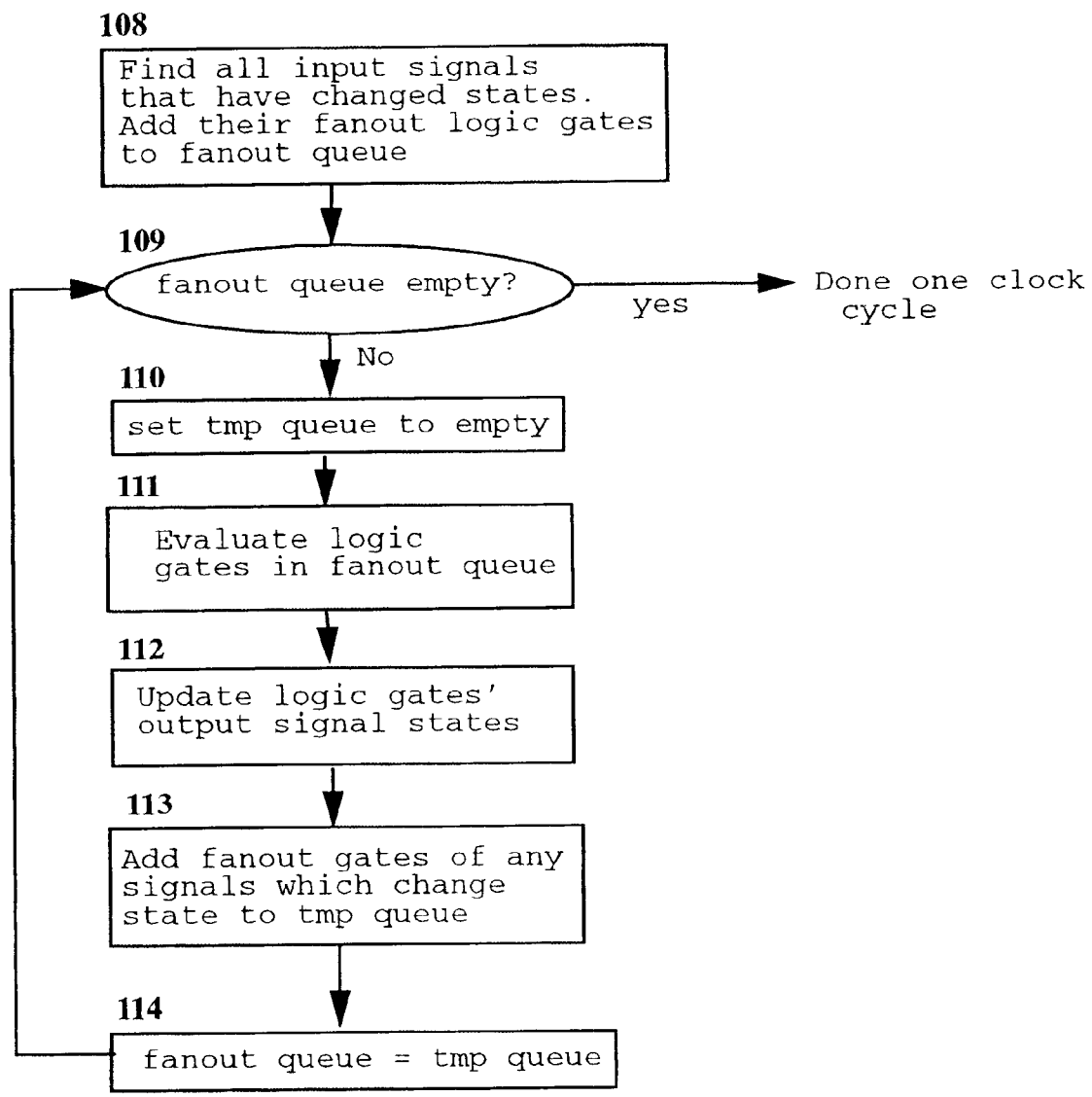
FIG. 20 depicts the process flow of an event-driven and cycle-based simulation algorithm that is executed by all master and slave threads concurrently in each simulation iteration.

Specifically, FIG. 20 depicts an event-driven cycle-based simulation process that is to be executed by all threads in any cycle-based simulation iteration. The process begins by first checking all input signals to a thread's logic region to see which of them have changed state in the previous simulation iteration/cycle (step 108 of FIG. 20). The fanout logic gates of these signals will be put into the thread's private fanout queue. The thread then checks if the fanout queue is empty (step 109 of FIG. 20). If it is empty, the thread has completed one simulation cycle. Otherwise, it will set a temporary queue to empty (step 110of FIG. 20) followed by removing and evaluating each of the logic gates from the fanout queue, and updates its output signals (steps 111–112 of FIG. 20). If the output signals of a logic gate changes state, all of its fanout logic gates which are in the same logic region of the current thread will be put into the temporary queue (steps 113 of FIG. 20). After all logic gates in the fanout queue are evaluated, the temporary queue content is transferred to the thread's fanout queue (steps 114 of FIG. 20). The thread then go back to check the fanout queue (step 109 of FIG. 20) to determine if it needs to process more logic gates from the fanout queue, or it has completed the simulation cycle. The aforementioned method ensures that only active logic gates in each logic region will be evaluated in each simulation iteration. It has been observed that this method has speedup the cycle-based simulator performance by about 10%.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

I claim:

1. A method of performing a multithreaded event-driven logic simulation of an integrated circuit design, coded in one or a plurality of Hardware Description Language ("HDL") languages including VHDL, Verilog languages and a mixed thereof on a multiprocessor platform, comprising the steps of:

(a) pre-examining each user-specified HDL source file and automatically invoking an appropriate HDL compiler to compile a design source file into a common design database;

(b) resolving any conflict in the design source file due to use of the plurality of HDL languages to ensure correct modeling and simulation of the design source file; and (c) automatically detecting the number of microprocessors (CPUs) available on the multiprocessor platform to create a master thread and a plurality of slave threads for concurrent execution of the multithreaded event-driven simulation of the design to achieve linear to super-linear scalable performance speedup as according to the number of CPUs on the multiprocessor platform.

2. The method of performing a multithreaded event-driven logic simulation according to claim 1 wherein the step of resolving any conflict in the design source file includes resolving design object names conflict and signal states incompatibility.

3. The method of performing a multithreaded event-driven logic simulation according to claim 2 wherein the step of resolving design object names conflict further comprises the step of providing a program switch for user to instruct the HDL compiler to use a VHDL style, case-insensitive object naming convention for all design object names.

4. The method of performing a multithreaded event-driven logic simulation according to claim 2 further comprises the step of automatically mapping Verilog states to VHDL states in simulation of the design source file to ensure the accuracy of simulation of mixed language design.

5. The method of performing a multithreaded event-driven logic simulation according to claim 1 wherein the step of (c) further comprises the steps of:

(a) creating a master thread and a plurality of slave threads based on the number of available CPUs on the multiprocessor platform, prior to simulation;

(b) keeping the slave threads in a sleeping mode while processing current events by the master slave itself during a simulation to conserve overhead in synchronizing the concurrent execution of the slave threads and waking up the slave threads by the master thread only when there are sufficient number of events to justify the use of slave threads;

(c) assigning events to the master and slave threads such that the master and slave threads all process nearly the same number of events concurrently to ensure load balancing;

(d) providing a per-thread specific event queue to store future events and a fanout queue to store zero-delay events;

(e) assigning a thread ID to each new event being put into a thread event or a fanout queue to ensure that the new event will be processed only once in the presence of a plurality of threads processing the same event concurrently;

(f) synchronizing between the master thread and the slave threads to put the master thread awaiting until all the slave threads finish processing assigned events and go back to the sleep mode; and (g) checking and repeating the steps of (b)–(e) if new events exist in the thread specific fanout or otherwise advancing the simulation time to a next event pending time.

6. The method of performing a multithreaded event-driven logic simulation according to claim 5 further comprises the step of allocating and maintaining a private heap memory region, an event queue and a fanout queue for each of the master thread and the slave threads at the beginning of the simulation to maximize concurrency and minimize thread synchronization when adding or deleting events during the simulation.

7. The method of performing a multithreaded event-driven logic simulation according to claim 1 wherein the multiprocessor platform is selected from platforms that support a plurality of microprocessors.

8. The method of performing a multithreaded event-driven logic simulation according to claim 1 further comprises the step of supporting an optional user-defined configuration file to allow users to define a preferred state mapping between the plurality of the HDL languages to ensure simulation accuracy.

9. A method of performing a multithreaded cycle-based logic simulation of an integrated circuit design, coded in one or a plurality of Hardware Description Language ("HDL") languages including VHDL, Verilog languages and a mixed thereof on a multiprocessor platform, comprising the steps of:

(a) pre-examining each user-specified HDL source file and automatically invoking an appropriate HDL compiler to compile a design source file into a common design database;

(b) resolving any conflict in the design source file due to use of the plurality of HDL languages to ensure correct modeling and simulation of the design source file; and (c) automatically detecting the number of microprocessors (CPUs) available on the multiprocessor platform to create a master thread and a plurality of slave threads for concurrent execution of the multithreaded cycle-based simulation of the design on the multiprocessor platform, to achieve linear to super-linear performance speedup as according to the number of CPUs on the multiprocessor platform.

10. The method of performing a multithreaded cycle-based logic simulation according to claim 9 wherein the step of resolving any conflict in the design source file includes resolving design object names conflict and signal states incompatibility.

11. The method of performing a multithreaded cycle-based logic simulation according to claim 10 wherein the step of resolving design object names conflict further comprises the step of providing a program switch for users to instruct the HDL compiler to use a VHDL style, case-insensitive object naming convention for all design object names.

12. The method of performing a multithreaded cycle-based logic simulation according to claim 9 further comprises the step of automatically mapping Verilog states to VHDL states in simulation of the design source file to ensure the accuracy of simulation of mixed language design.

13. The method of performing a multithreaded cycle-based logic simulation according to claim 9 wherein the step of (c) further comprises the steps of:
(a) creating a master thread and a plurality of slave threads based on the number of avail able CPUs on the multiprocessor platform, prior to the start of simulation;
(b) partitioning the design into a number of regions equal to the number of available CPUs;
(c) assigning each of the regions to a thread;
(d) keeping the slave threads in a sleeping mode and waking them up by the master thread at the beginning of each clock cycle;
(e) processing by the master and slave threads of their respective assigned regions concurrently in each clock cycle;
(f) instructing the master thread to wait for the slave threads to finish processing all events in their assigned regions and go back to the sleep mode; and
(g) advancing the simulation time to a next clock cycle.

14. The method of performing a multithreaded cycle-based logic simulation according to claim 9 further comprises the step of ranking logic gates in each regions such that the logic gates near inputs of the regions are evaluated first followed by their fanout logic gates before any of subsequent logic levels being evaluated in each clock cycle.

15. The method of performing a multithreaded cycle-based logic simulation according to claim 9 further comprises the step of instructing the simulator to repeat a simulation iteration in a current clock cycle or to start a new simulation cycle by the master thread base on changed states of interface signals between regions.

16. A method of executing a multithreaded mixed event-driven and cycle-based logic simulation of a circuit design coded in one or a plurality of Hardware Description Language ("HDL") languages including VHDL, Verilog languages and a mixed thereof on a multiprocessor platform, comprising the steps of:
(a) pre-examining each user-specified HDL source file and automatically invoking an appropriate HDL compiler to compile a design source file into a common design database;
(b) resolving any conflict in the design source file due to use of the plurality of HDL languages to ensure correct model and simulation of the design source file; and
(c) automatically detecting the number of microprocessors (CPUs) available on the multiprocessor platform to create a master thread and a plurality of slave threads for concurrent execution of the mixed event-driven and cycle-based simulation of the design, to achieve linear to super-linear performance speedup as according to the number of CPUs on the multiprocessor platform.

17. The method of executing a multithreaded mixed event-driven and cycle-based logic simulation according to claim 16 wherein the step of resolving any conflict in the design source file includes resolving design object names conflict and signal states incompatibility.

18. The method of executing a multithreaded mixed event-driven and cycle-based logic simulation according to claim 16 wherein the step of resolving design object names conflict further comprises the step of providing a program switch for users to instruct the HDL compiler to use a VHDL style, case-insensitive, object naming convention for all design object names.

19. A method of executing remote Hardware Description Language ("HDL") compilation and multithreaded simulation (event-driven, cycle-based, and a combination of both) of a circuit design employing a user's local and remote single-processor or multiprocessor hosts, comprising the steps of:
installing a server program on the user's remote hosts to which the HDL designs compilation and simulation is to be performed;
installing and executing a graphical user interface program ("GUI") on the user's local host to specify remote hosts on which the HDL design compilation and simulation is to be performed;
automatically activating network connection by the GUI to the server program to send the user's commands from the user's local host to the remote hosts to be executed thereof; and
transferring simulation results from the remote hosts back to the user's local host for display.

20. The method of executing remote Hardware Description Language ("HDL") compilation and logic simulation according to claim 19 further comprises the step of providing an interface function to support network transports and communication between the UI and the server program.

21. The method of executing remote Hardware Description Language ("HDL") compilation and multithreaded simulation according to claim 19 wherein the step of providing an interface function includes the step of using an industrial standard remote process communication protocol selecting from the group consisting of Java™ Remote Method Invocation (RMI), sockets, remote procedure call and COBRA].

22. The method of executing remote Hardware Description Language ("HDL") compilation and logic simulation according to claim 19 wherein the user's local host and the remote hosts can be operated in different platforms, and each host may contain single processor or multiple processors.

23. A program product of executing remote Hardware Description Language ("HDL") compilation and multithreaded simulation of a circuit design employing a user's local and remote single-processor or multiprocessor hosts, comprising:
means to provide a server program on the user's remote hosts to which the HDL designs compilation and simulation is to be performed;
means to provide a graphical user interface program ("GUI") on the user's local host to specify remote hosts on which the HDL design compilation and simulation is to be performed;
means to automatically activate network connection by the GUI to the server program to send the user's commands from the user's local host to the remote hosts to be executed thereof; and
means to transfer simulation results from the remote hosts back to the user's local host for display.

24. The program product of executing remote Hardware Description Language ("HDL") compilation and multithreaded simulation according to claim 23 further comprises means to provide an interface function to support network transports and communication between the GUI and the server program.

25. The program product of executing remote Hardware Description Language ("HDL") compilation and multithreaded simulation according to claim 23 wherein the user's local host and the remote hosts can be operated in different platforms, and each host may contain single processor or multiple processors.

26. A method of providing job scheduling for Hardware Description Language ("HDL") logic simulation of a circuit on any single processor or multiprocessor platform networked with a local host and remote hosts, comprising the steps of:

receiving a graphical user interface program ("GUI") on the local host to create a private directory to compile and store user-defined jobs;

creating a child process by the GUI for each of the user-defined jobs to be processed independently by their respective child processes;

prompting the child process to compute an elapsed time between user-specified schedule time(s) and current time to allow the child process to go into a sleep mode for a period of and until the expiry of the elapsed time;

waking up the child process at the user-specified schedule time(s) to complete execution of the user-defined jobs; and instructing the child process either to go back to sleep mode if there are yet other scheduled time(s) for the user-defined jobs or to terminate itself if there is no other scheduled time for the user-defined jobs.

27. The method of providing job scheduling for Hardware Description Language ("HDL") logic simulation according to claim 26 further comprises the step of providing remote job scheduling including installing a server program on the remote hosts to which the HDL logic simulation is to be performed by the simulator networked through Internet or intranets.

28. The method of providing job scheduling for Hardware Description Language ("HDL") logic simulation according to claim 26 further comprises the step of providing a job cancellation function which includes instructing the UI to locate a job by name followed by killing the child process that is associated with the job and removing the corresponding job description database file from the UI.

29. The method of providing job scheduling for Hardware Description Language ("HDL") logic simulation according to claim 26 further comprises the step of providing a job modification function which includes instructing the UI to bring up and allows users to edit a menu for a scheduled job so that the UI will first delete the scheduled job and add new scheduled job followed by creating a child process to re-schedule the new scheduled job.

30. The method of providing job scheduling for Hardware Description Language ("HDL") logic according to claim 26 further comprises the step of providing a means to support user-defined post processing functions which includes sending emails to users, executing user-defined shell commands, and logging the job execution.

31. A program product of providing job scheduling for Hardware Description Language ("HDL") logic simulation of a circuit on any single processor or multiprocessor platform networked with a local host and remote hosts, comprising:

means to receive a graphical user interface program ("GUI") on the local host to create a private directory to compile and store user-defined jobs;

means to create a child process by the GUI for each of the user-defined jobs to be processed independently by their respective child processes;

means to prompt the child process to compute an elapsed time between user-specified schedule time(s) and current time to allow the child process to go into a sleep mode for a period of and until the expiry of the elapsed time;

means to wake up the child process at the user-specified schedule time(s) to complete execution of the user-defined jobs; and means to inactivate the child process by instructing the child process either to resume to sleep mode when there are unexpired scheduled time(s) for the user-defined jobs or to terminate itself when there is no unexpired scheduled time for the user-defined jobs.

32. The program product of providing job scheduling according to claim 31 further comprises means to provide remote job scheduling including installing a server program on the remote hosts to which the HDL logic simulation is to be performed by the simulator networked through Internet or intranets.

33. The program product of providing job scheduling according to claim 31 further comprises the means to provide a job cancellation function which includes instructing the UI to locate a job by name followed by killing the child process that is associated with the job and removing the corresponding job description file from the UI.

34. The program product of providing job scheduling according to claim 31 further comprises means to provide a job modification function which includes instructing the UI to bring up and allows users to edit a menu for a scheduled job so that the UI will first delete the scheduled job and add new scheduled job followed by creating a child process to re-schedule the new scheduled job.

35. The program product of providing job scheduling according to claim 31 further comprises means to provide a user-defined post processing function which includes sending emails to users, executing user-defined shell commands, and logging the job execution.

36. A method of achieving super-linear scalable Hardware Description Language simulation for a multithreaded event-driven simulation of a circuit design on a multiprocessor platform, comprising the steps of:

(a) minimizing frequencies of thread creation and destruction by creating a master thread and a plurality of slave threads, based on the number of available CPUs on the multiprocessor platform, prior to the start of simulation;

(b) minimizing thread interaction and synchronization by assigning a private heap memory, event queue, and fanout queue region for each of the master thread and the slave threads at the beginning of the simulation to eliminate thread synchronization resulting from subsequent addition or deletion of signals or logic gate events during the simulation; and (c) maximizing thread concurrency by processing multiple signals concurrently rather than serially by the master thread and the slave threads such that each of the master thread and the slave threads will process an individual signal state in parallel with the others.

37. The method of achieving super-linear scalable Hardware Description Language simulation according to claim 36 further comprises the step of blocking the slave threads by a system-supplied synchronization object at the beginning of each simulation cycle when the slave threads are not scheduled to perform simulation tasks.

38. The method of achieving super-linear scalable Hardware Description Language simulation according to claim 36 further comprises the step of unblocking the slave threads by a single system call by the master thread when circuit activities exceed a pre-determined heuristic threshold value to minimize thread activation overheads.

39. The method of achieving super-linear scalable Hardware Description Language simulation according to claim 36 further comprises the step of scheduling the master thread and the slave threads to bind to CPUs of the microprocessor by at the beginning of simulation to eliminate the time spent in scheduling threads for execution during subsequent simulation.

40. The method of achieving super-linear scalable Hardware Description Language simulation according to claim 36 wherein the step (c) further comprises the step of defining a threshold value for signal events and logic gate to each threads such that the master thread will either process the signal events and logic gate itself if the number thereof is less than the threshold value or wake up the slave threads if the number thereof exceeds the threshold value.

41. The method of achieving super-linear scalable Hardware Description Language simulation according to claim 36 wherein the step (b) further comprises the step of tagging and matching fanout logic gates to each of the correspondent fanout queue with a per-thread specific identification number during the process to further avoid thread synchronization and to eliminate duplicated logic gates evaluation.

42. The method of achieving super-linear scalable Hardware Description Language simulation according to claim 36 further comprises the step of setting two global synchronization variables to the slave threads to determine if the slave threads be unblocked to iterate a simulation inner loop or if the slave threads be blocked to exit the simulation inner loop.

43. The method of achieving super-linear scalable Hardware Description Language simulation according to claim 40 wherein the threshold value is preferably set at n/2 for signal events and at n for the logic gate events, where n is the number of CPUs available on the platform.

44. The method of achieving super-linear scalable Hardware Description Language simulation according to claim 36 wherein the step (c) further comprises the step of pushing the signal's fanout logic gates into a per-thread specific fanout queue until all of signal and logic gates events assigned to each of the master thread and the slave threads have been processed in a simulation cycle.

45. A program product of achieving super-linear scalable Hardware Description Language simulation for an event-driven logic simulation of a circuit design on a multiprocessor platform, comprising:
means to minimize frequencies of thread creation and destruction by creating a master thread and a plurality of slave threads based on the number of available CPUs on the multiprocessor platform, prior to the start of simulation;
means to minimize thread interaction and synchronization by assigning a private heap memory, event queue, and fanout queue region for each of the master thread and the slave threads at the beginning of the simulation to eliminate thread synchronization resulting from subsequent addition or deletion of signals or logic gate events during the simulation; and
means to maximize thread concurrency by processing multiple signals concurrently rather than serially by the master thread and the slave threads such that each of the master thread and the slave threads will process an individual signal state in parallel with the others.

46. The program product according to claim 45 further comprises means to block the slave threads by a system-supplied synchronization object at the beginning of each simulation cycle when the slave threads are not scheduled to perform simulation tasks.

47. The program product according to claim 45 further comprises means to unblock the slave threads by a single system call by the master thread when circuit activities exceed a pre-determined heuristic threshold value to minimize thread activation overheads.

48. The program product according to claim 45 further comprises means to schedule the master thread and the slave threads to bind to CPUs of the microprocessor by an operating at the start of simulation to minimize the time spent in scheduling threads for execution.

49. The program product according to claim 45 wherein the means to maximize thread concurrency further comprises means to define threshold values for signal events and logic gate events to each threads such that the master thread will either process the signal events and logic gate events itself if the number thereof is less than the threshold values or unblock the slave threads otherwise to minimize the slave thread activation overheads if the number thereof exceeds the threshold values.

50. The program product according to claim 45 wherein the means to minimize thread interaction and synchronization further comprises means to tag and match fanout logic gates to each of the correspondent fanout queue with a per-thread specific identification number during the process to further avoid thread synchronization and to eliminate duplicated logic gates evaluation.

51. The program product according to claim 45 further comprises means to assign two global synchronization variables to the slave threads to determine if the slave threads be unblocked to iterate a simulation inner loop or if the slave threads be blocked to exit the simulation inner loop.

52. The program product according to claim 49 wherein the threshold value is preferably set at n/2 for signal events and at n for the logic gate events, where n is the number of CPUs available on the platform.

53. The program product according to claim 45 wherein the means to maximize thread concurrency further comprises means to push the signal's fanout logic gates into a per-thread specific fanout queue until all of signal and logic gates events assigned to each of the master thread and the slave threads have been processed in a simulation cycle.

54. The method of performing a multithreaded cycle-based logic simulation according to claim 9 further comprises the step of allocating and maintaining a private heap memory region and a fanout queue for each of the master thread and the slave threads at the beginning of the simulation to minimize thread synchronization during the simulation.

55. The method of performing a multithreaded cycle-based logic simulation according to claim 9 wherein the multiprocessor platform is selected from any platforms that support a plurality of microprocessors.

56. The method of performing a multithreaded cycle-based logic simulation according to claim 9 further comprises the step of supporting an optional user-defined configuration file to allow users to define a preferred state mapping between the plurality of the HDL languages.

57. The method executing a multithreaded mixed event-driven and cycle-based logic simulation according to claim 17 further comprises the step of automatically mapping Verilog states to VHDL states in simulation of the design source file to ensure the accuracy of simulation of mixed language design.

58. The method executing a multithreaded mixed event-driven and cycle-based logic simulation according to claim 16 wherein the step of (c) further comprises the steps of:
(a) creating a master thread and a plurality of slave threads, based on the number of CPUs on the multiprocessor platform, prior to simulation;
(b) partitioning the design into a number of regions equal to the number of available CPUs and assigning each of the regions to a thread;

(c) defining clock cycle periods prior to the simulation to specify regions to be processed by either the cycle-based or the event-driven methods;

(d) partitioning further the design into event-driven logic regions and the cycle-based logic regions at the beginning of the simulation such that the master thread will instruct the slave threads to perform simulation on the logic regions when the current time is at the beginning of a clock-cycle boundary or, in the alternative, to evaluate the event-driven regions only at other simulation time points;

(e) keeping the slave threads in a sleeping mode and awakening them by the master thread at the beginning of each clock cycle or event time;

(f) instructing the master thread to wait for the slave threads to finish processing all events in their assigned regions and go back to the sleep mode; and (g) advancing the simulation time to a next clock cycle or event time.

59. The method of executing a multithreaded mixed event-driven and cycle-based logic simulation according to claim 9 further comprises the step of evaluating and processing logic gates for the cycle-based logic regions and events for the event-driven logic regions for the present clock cycle time until at the end of each simulation cycle at which the master thread will advance the simulation time.

* * * * *

UNITED STATES PATENT AND TRADEMARK OFFICE
CERTIFICATE OF CORRECTION

PATENT NO. : 6,466,898 B1
APPLICATION NO. : 09/229134
DATED : October 15, 2002
INVENTOR(S) : Terence Chan It is certified that error appears in the above-identified patent and that said Letters Patent is hereby corrected as shown below:

In column 28, at line 65, for the claim 39, the partial sentence "by at the beginning" should read "at the beginning".

Signed and Sealed this
Nineteenth Day of March, 2013

Teresa Stanek Rea
*Acting Director of the United States Patent and Trademark Office*

UNITED STATES PATENT AND TRADEMARK OFFICE
CERTIFICATE OF CORRECTION

PATENT NO.         : 6,466,898 B1  
APPLICATION NO.    : 09/229134  
DATED              : October 15, 2002  
INVENTOR(S)        : Terence Chan It is certified that error appears in the above-identified patent and that said Letters Patent is hereby corrected as shown below:

In the Specification

In Column 4, at line 50, of Table 1, the word "SpeedSim-MT" should read "SpeedWave/MT"

In Column 4, at line 54, of Table 1, the word "SpeedWave" should read "SpeedSim"

In Column 9, at line 21, of Table 2, the word "SpeedSim-MT" should read "SpeedWave/MT"

In Column 9, at line 26, of Table 2, the word "SpeedWave" should read "SpeedSim"

Signed and Sealed this  
Twenty-third Day of July, 2013

Teresa Stanek Rea  
*Acting Director of the United States Patent and Trademark Office*